US012733347B2

(12) United States Patent
Lee et al.

(10) Patent No.: US 12,733,347 B2
(45) Date of Patent: Sep. 8, 2026

(54) DISPLAY DEVICE

(71) Applicant: LG Display Co., Ltd., Seoul (KR)

(72) Inventors: Seongjoo Lee, Gyeonggi-do (KR); SeungHee Nam, Gyeonggi-do (KR); JungSun Baek, Gyeonggi-do (KR); Seungpyo Hong, Busan (KR)

(73) Assignee: LG Display Co., Ltd., Seoul (KR)

(*) Notice: Subject to any disclaimer, the term of this patent is extended or adjusted under 35 U.S.C. 154(b) by 336 days.

(21) Appl. No.: 18/389,073

(22) Filed: Nov. 13, 2023

(65) Prior Publication Data

US 2024/0244886 A1 Jul. 18, 2024

(30) Foreign Application Priority Data

Jan. 17, 2023 (KR) ........................ 10-2023-0006860

(51) Int. Cl.
*H10K 59/122* (2023.01)
*H10K 59/35* (2023.01)

(52) U.S. Cl.
CPC ........... *H10K 59/122* (2023.02); *H10K 59/35* (2023.02)

(58) Field of Classification Search
CPC .... H10K 59/122; H10K 59/35; H10K 59/124; H10K 59/352; H10K 59/353; H10K 59/80518; H10K 59/878; H10K 59/60; H10K 59/8051; H10K 59/8052
See application file for complete search history.

(56) References Cited

U.S. PATENT DOCUMENTS

| | | | | |
|---|---|---|---|---|
| 2019/0237523 | A1 | 8/2019 | Zhai et al. | |
| 2020/0373520 | A1 | 11/2020 | Kim et al. | |
| 2021/0183964 | A1* | 6/2021 | Jang | H10K 59/38 |
| 2022/0059629 | A1* | 2/2022 | Park | H10K 59/122 |
| 2022/0069042 | A1 | 3/2022 | Jung et al. | |
| 2022/0208890 | A1 | 6/2022 | Liu et al. | |
| 2022/0392978 | A1* | 12/2022 | Bae | H10K 59/123 |

FOREIGN PATENT DOCUMENTS

| | | | |
|---|---|---|---|
| CN | 111341815 | A | 6/2020 |
| KR | 10-2020-0135068 | A | 12/2020 |
| KR | 10-2022-0027448 | A | 3/2022 |

OTHER PUBLICATIONS

Office Action issued on Jul. 16, 2026 for Korean Patent Application No. 10-2023-0006860.

* cited by examiner

*Primary Examiner* — Donald L Raleigh
(74) *Attorney, Agent, or Firm* — Morgan, Lewis & Bockius LLP

(57) ABSTRACT

A display device may include a substrate including a display area configured to display an image and a non-display area outside the display area, and a plurality of subpixels in the display area. The plurality of subpixels may include a first subpixel of a first color, the first subpixel including a first opening corresponding to a first light emission area and a second opening spaced apart from the first opening and corresponding to a second light emission area. The plurality of subpixels may further include a second subpixel of a second color different from the first color and including a third opening corresponding to a third light emission area.

25 Claims, 19 Drawing Sheets

PXL1 { SP1, SP2, SP3

PXL2 { SP4, SP5, SP6

DISPLAY DEVICE

CROSS-REFERENCE TO RELATED APPLICATION

This application claims priority from Korean Patent Application No. 10-2023-0006860, filed on Jan. 17, 2023, which is hereby incorporated by reference for all purposes as if fully set forth herein.

BACKGROUND

Technical Field

Embodiments of the present disclosure relate to display devices.

Description of Related Art

With the development of technology, a display device may provide a capture function and various detection functions in addition to an image display function. To this end, the display device may include an optical electronic device (also referred to as a light receiving device or sensor), such as a camera and a detection sensor.

Since the optical electronic device may receive light from the front of the display device, it should be installed where light reception is easy. Accordingly, conventionally, the camera (camera lens) and the detection sensor had to be installed to be exposed on the front surface of the display device. Thus, the bezel of the display panel was widened, or a notch or physical hole was formed in the display area of the display panel, and a camera or a detection sensor is installed there.

Therefore, as the display device is equipped with optical electronic devices, such as cameras, detection sensors, and the like, that perform a specified function by receiving light from the front, the front of the display device may have a relatively large bezel or the front design of the display device may be restricted.

In another aspect, display devices may require excellent display quality and luminous efficiency. In particular, display devices may be required to maintain excellent display quality even when the user's viewing angle changes.

A display device may include light emitting elements that emit light of different colors to express various colors. However, since light emitting elements emitting light of different colors have different device characteristics, it is difficult to maintain uniform display quality even at a wide viewing angle.

SUMMARY

The present disclosure is directed to a display device that substantially obviates one or more of the problems due to limitations and disadvantages of the related art.

Color coordinates may change as the viewing angle of the display area of the display device increases. In particular, where the display device includes subpixels emitting light of different colors, color coordinates may be distorted in a side viewing angle direction with respect to subpixels of one or more colors. A display device has been invented which has a light transmission structure in which an optical electronic device is provided under the display area of a display panel such that the optical electronic device may normally receive light without exposing the optical electronic device from the front of the display device. However, where a transmission portion is formed to implement the light transmission structure, the number of pixels per unit area may be reduced due to the transmission portion, resulting in further deterioration of display quality in the side viewing angle direction. Accordingly, the inventors of the present disclosure have invented a display device capable of having excellent luminance and color characteristics even in a side viewing angle direction.

Embodiments of the present disclosure may provide a display device capable of having excellent luminance and color characteristics in a side viewing angle direction by including a first subpixel corresponding to a first color and having a first opening and a second opening, and a second subpixel corresponding to a second color different from the first color and having a third opening.

Embodiments of the present disclosure may provide a display device capable of low-power driving by having excellent luminance characteristics in a side viewing angle direction.

To achieve these objects and other advantages of the present disclosure, as embodied and broadly described herein, a display device may include: a substrate including a display area configured to display an image and a non-display area outside the display area; and a plurality of subpixels in the display area. The plurality of subpixels may include: a first subpixel of a first color, the first subpixel including a first opening corresponding to a first light emission area and a second opening spaced apart from the first opening and corresponding to a second light emission area; and a second subpixel of a second color different from the first color and including a third opening corresponding to a third light emission area.

In another aspect of the present disclosure, a display device may include: a substrate including a display area having an optical area and a normal area outside the optical area, the optical area and the normal area being configured to display an image, the optical area having at least one transmissive area configured to transmit light, and a non-display area outside the display area; and a plurality of subpixels in the optical area and the normal area. The plurality of subpixels may include a first subpixel in the optical area and including a first opening corresponding to a first light emission area and a second opening spaced apart from the first opening and corresponding to a second light emission area, the first subpixel being configured to emit light of a first color at the first light emission area and the second light emission area.

In yet another aspect of the present disclosure, a display device may include: a substrate; a plurality of subpixels on the substrate, and at least one transmissive area between the plurality of subpixels, the at least one transmissive area being configured to transmit light. The plurality of subpixels may include: a first subpixel including a first light emission area and a second light emission area spaced apart from the first light emission area, the first subpixel being configured to emit light of a first color at the first light emission area and the second light emission area; and a second subpixel of a second color different from the first color and including a third light emission area.

Embodiments of the present disclosure may provide a display device comprising a first subpixel corresponding to a first color and a second subpixel corresponding to a second color different from the first color. The first subpixel may include a first opening and a second opening, and the second subpixel may include a third opening.

Embodiments of the present disclosure may provide a display device including a planarization layer, an anode electrode, and a light emitting layer. The planarization layer may include a first concave portion, a second concave portion, a partition wall portion, a first inclined surface, and a second inclined surface. The first concave portion may correspond to a first opening, and the second concave portion may correspond to a second opening. The partition wall portion may be positioned between the first concave portion and the second concave portion. The first inclined surface may be positioned outside the first concave portion, and the second inclined surface may be positioned outside the second concave portion. The anode electrode may be positioned on the first concave portion, the second concave portion, the partition wall portion, the first inclined surface, and the second inclined surface. The light emitting layer may be positioned on the anode electrode exposed by the first opening and the second opening.

Embodiments of the present disclosure may provide the display device in which a first height of the first inclined surface with respect to the first concave portion is different from a second height of the second inclined surface with respect to the second concave portion.

Embodiments of the present disclosure may provide the display device comprising a first optical area, a normal area, and a cathode electrode. The normal area may be positioned outside the first optical area. The cathode electrode may include a plurality of cathode holes in the first optical area.

According to embodiments of the disclosure, there may be provided a display device capable of having excellent luminance and color characteristics in a side viewing angle direction by including a first subpixel corresponding to a first color and having a first opening and a second opening and a second subpixel corresponding to a second color different from the first color and having a third opening.

According to embodiments of the disclosure, there may be provided a display device capable of low-power driving by having excellent luminance characteristics in a side viewing angle direction.

It is to be understood that both the foregoing general description and the following detailed description of the present disclosure are by way of example and are intended to provide further explanation of the disclosures as claimed.

BRIEF DESCRIPTION OF DRAWINGS

The accompanying drawings, which are included to provide a further understanding of the disclosure and are incorporated in and constitute a part of this application, illustrate example embodiments of the disclosure and together with the description serve to explain the principles of the disclosure. In the drawings.

DETAILED DESCRIPTION

Figure 1A:
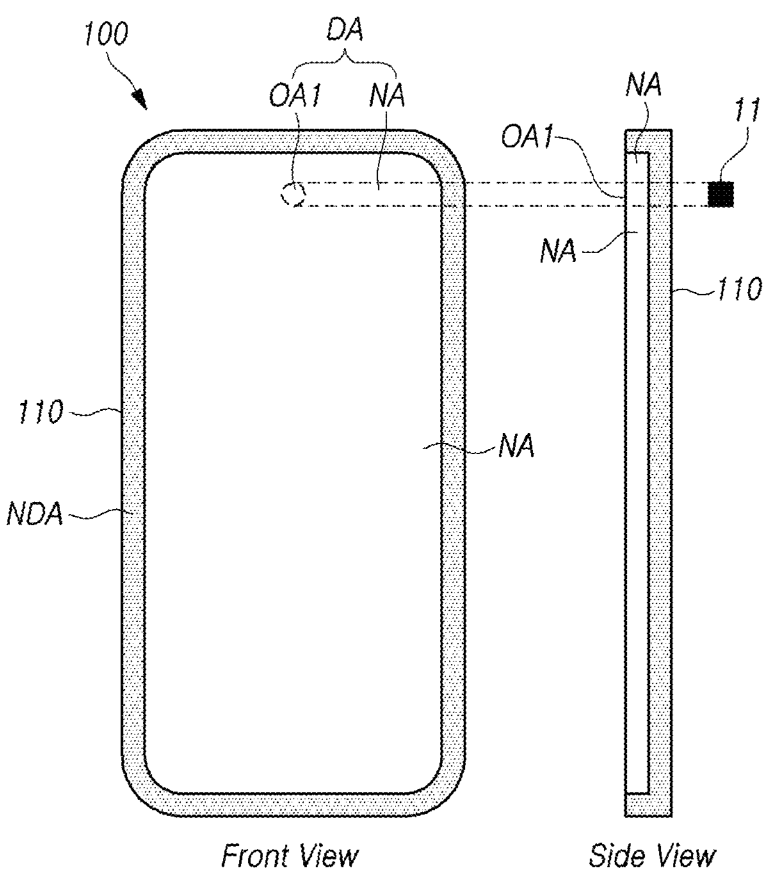
FIGS. 1A, 1B, and 1C illustrate a display device according to example embodiments of the present disclosure.

Reference will now be made in detail to embodiments of the present disclosure, examples of which are illustrated in the accompanying drawings.

Advantages and features of the present disclosure, and methods of achieving them will become apparent with reference to the example embodiments described below in detail in conjunction with the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

The same reference numerals and signs generally denote the same or like elements throughout the specification and drawings, unless otherwise specified.

In the following description, where a detailed description of a relevant known function or configuration may unnecessarily obscure aspects of the present disclosure, a detailed description of such a known known function or configuration may be omitted or be briefly discussed.

Where a term like "comprise," "have," "include," "contain," "constitute," "made up of," or "formed of" is used, one or more other elements may be added unless a more limiting term, such as "only" or the like, is used. An element described in the singular form is intended to include a plurality of elements, and vice versa, unless the context clearly indicates otherwise.

Although the terms "first," "second," "A," "B," "(A)," "(B)," and the like may be used herein to describe various elements, these elements should not be interpreted to be limited by these terms as they are not used to define a particular essence, order, sequence, precedence, or number of such elements. These terms are used only to distinguish one element from another. For example, a first element could be termed a second element, and a second element could similarly be termed a first element, without departing from the scope of the present disclosure.

Where an expression that an element or layer "is connected to," "is coupled to," "is adhered to," "contacts," or "overlaps" another element or layer is used, the element or layer not only can be directly connected, coupled, or adhered to or directly contact or overlap another element or layer, but also can be indirectly connected, coupled, or adhered or indirectly contact or overlap another element or layer with one or more intervening elements or layers "disposed" or "interposed" between the elements or layers, unless otherwise specified.

Where a temporal relationship between processes, operations, flows, steps, events, or the like is described as, for example, "after," "subsequent," "next," or "before," the relationship encompasses not only a continuous or sequential order but also a non-continuous or non-sequential relationship unless a more limiting term, such as "just," "immediate(ly)," or "direct(ly)," is used.

In addition, where any dimensions, relative sizes, and the like are discussed, numerical values for an elements or features, or corresponding information (e.g., level, range, etc.) should be considered to include a tolerance or error range that may be caused by various factors (e.g., process factors, internal or external impact, noise, etc.) even where no explicit description of such a tolerance or error range is provided. Further, the term "may" fully encompasses all the meanings of the term "can."

Hereinafter, various example embodiments of the present disclosure are described in detail with reference to the accompanying drawings.

Figure 1B:
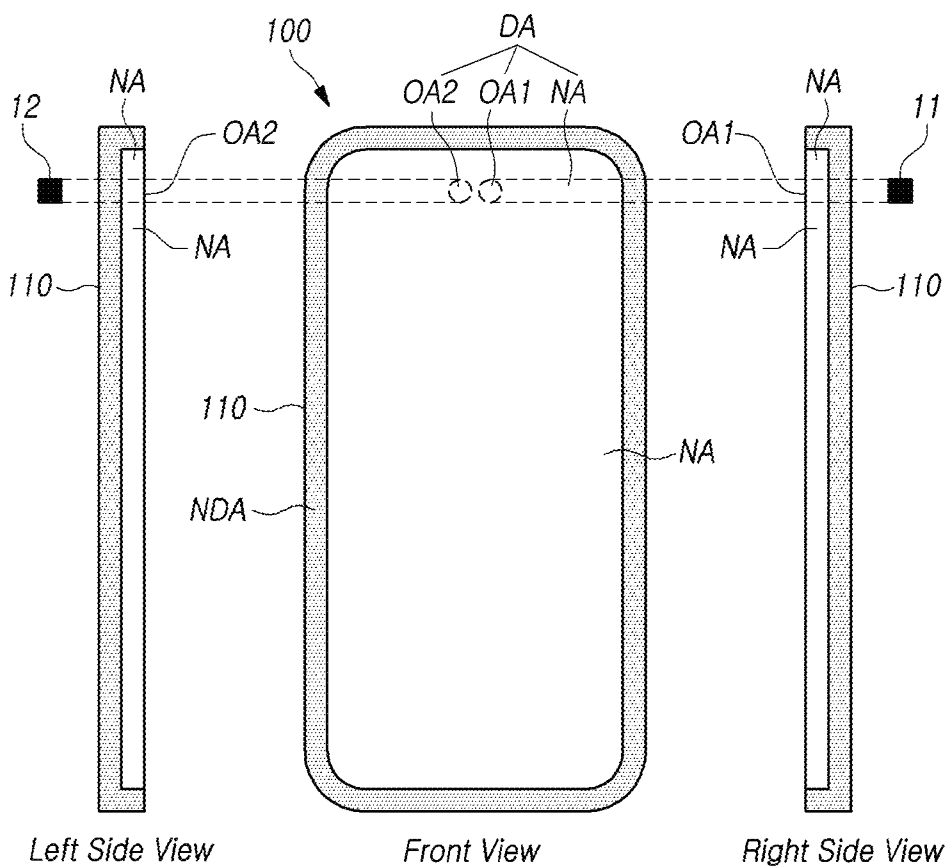
Figure 1C:
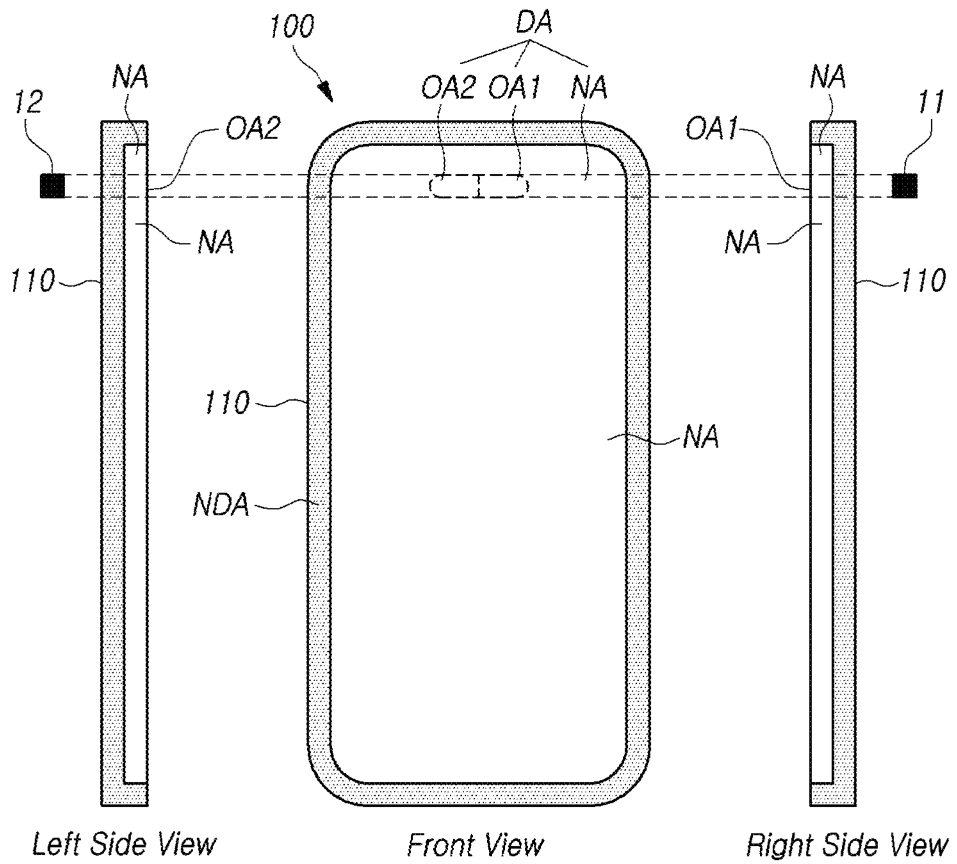

FIGS. 1A, 1B, and 1C illustrate a display device 100 according to example embodiments of the present disclosure.

As shown in FIGS. 1A, 1B, and 1C, a display device 100 according to example embodiments of the present disclosure may include a display panel 110 for displaying images and one or more optical electronic devices 11 and 12.

The display panel 110 may include a display area DA, in which images may be displayed, and a non-display area NDA, in which no image is displayed.

A plurality of subpixels may be disposed in the display area DA, and various signal lines for driving the plurality of subpixels may also be disposed in the display area DA.

The non-display area NDA may be an area outside the display area DA. In the non-display area NDA, various signal lines may be disposed, and various driving circuits may be connected thereto. The non-display area NDA may be bent to be invisible from the front or may be covered by a case (not shown). The non-display area NDA may also be referred to as a bezel or a bezel area.

As illustrated in FIGS. 1A, 1B, and 1C, in the display device 100 according to example embodiments of the present disclosure, one or more optical electronic devices 11 and 12 may be electronic components that are provided and installed separately from the display panel 110 and are positioned under the display panel 110 (side opposite to the viewing surface).

Light may enter the front surface (viewing surface) of the display panel 110 and pass through the display panel 110 to one or more optical electronic devices 11 and 12 positioned under the display panel 110 (opposite to the viewing surface). For example, the light passing through the display panel 110 may include visible light, infrared light, or ultraviolet light.

The one or more optical electronic devices 11 and 12 may be devices that receive the light transmitted through the display panel 110 and are configured to perform a predetermined function according to the received light. For example, the one or more optical electronic devices 11 and 12 may include one or more of a capture device, such as a camera (or an image sensor), and a detection sensor, such as a proximity sensor or an illuminance sensor. For example, the detection sensor may be an infrared sensor.

As shown in FIGS. 1A, 1B, and 1C, in the display panel 110 according to example embodiments of the present disclosure, the display area DA may include a normal area NA and one or more optical areas OA1 and OA2. The one or more optical areas OA1 and OA2 may be areas overlapping the one or more optical electronic devices 11 and 12, respectively.

According to the example of FIG. 1A, the display area DA may include the normal area NA and the first optical area OA1. At least a portion of the first optical area OA1 may overlap the first optical electronic device 11.

According to the example of FIG. 1B, the display area DA may include a normal area NA, a first optical area OA1, and a second optical area OA2. In the example of FIG. 1B, the normal area NA may be present between the first optical area OA1 and the second optical area OA2. At least a portion of the first optical area OA1 may overlap the first optical electronic device 11, and at least a portion of the second optical area OA2 may overlap the second optical electronic device 12.

According to the example of FIG. 1C, the display area DA may include a normal area NA, a first optical area OA1, and a second optical area OA2. In the example of FIG. 1C, the normal area NA is not present between the first optical area OA1 and the second optical area OA2. In other words, the first optical area OA1 and the second optical area OA2 touch or border each other. At least a portion of the first optical area OA1 may overlap the first optical electronic device 11, and at least a portion of the second optical area OA2 may overlap the second optical electronic device 12.

The one or more optical areas OA1 and OA2 may have both an image display structure and a light transmission structure. In other words, since the one or more optical areas OA1 and OA2 are partial areas of the display area DA, emission areas of subpixels for displaying images may be disposed in the one or more optical areas OA1 and OA2. A light transmission structure for transmitting light to the one or more optical and electronic devices 11 and 12 may also be formed in one or more optical areas OA1 and OA2.

The one or more optical electronic devices 11 and 12 are devices that require light reception, but are positioned behind (or below, opposite to the viewing surface) the display panel 110 to receive the light transmitted through the display panel 110. The one or more optical electronic devices 11 and 12 are not exposed on the front surface (viewing surface) of the display panel 110. Therefore, when the user looks at the front surface of the display device 110, the optical electronic devices 11 and 12 are not visible to the user.

For example, the first optical electronic device 11 may be a camera, and the second optical electronic device 12 may be a detection sensor, such as a proximity sensor or an illuminance sensor. For example, the detection sensor may be an infrared sensor that detects infrared rays. Conversely, the first optical electronic device 11 may be a detection sensor, and the second optical electronic device 12 may be a camera.

Hereinafter, for convenience of description, it is assumed that the first optical electronic device 11 is a camera and the second electronic device 12 is an infrared (IR)-based detection sensor, but the present disclosure is not limited to this example. The camera may be a camera lens or an image sensor.

If the first optical electronic device 11 is a camera, the camera may be a front camera that is positioned behind (below) the display panel 110 but may be configured to capture images in front of the display panel 110. Accordingly, the user may take a photograph through the camera invisible on the viewing surface while viewing the viewing surface of the display panel 110.

The normal area NA and one or more optical areas OA1 and OA2 included in the display area DA are areas that may display images. The normal area NA is an area that does not require a light transmission structure to be formed, and the one or more optical areas OA1 and OA2 are areas that require a light transmission structure to be formed.

Accordingly, the one or more optical areas OA1 and OA2 may have a transmittance higher than or equal to a certain level, and the normal area NA may have no light transmittance or a lower transmittance than the certain level.

For example, one or more optical areas OA1 and OA2 and the normal area NA may have different resolutions, subpixel placement structures, numbers of subpixels per unit area, electrode structures, line structures, electrode placement structures, or line placement structures.

For example, the number of subpixels per unit area in one or more optical areas OA1 and OA2 may be smaller than the number of subpixels per unit area in the normal area NA. In other words, the resolution of one or more optical areas OA1 and OA2 may be lower than the resolution of the normal area NA. Here, the number of subpixels per unit area may be meant to be equivalent to a resolution, a pixel density, or a pixel integration degree. For example, the unit for the number of subpixels per unit area may be pixels per inch (PPI), which means the number of pixels in one inch.

For example, the number of subpixels per unit area in the first optical area OA1 may be smaller than the number of subpixels per unit area in the normal area NA. The number of subpixels per unit area in the second optical area OA2 may be larger than or equal to the number of subpixels per unit area in the first optical area OA1 and be smaller than the number of subpixels per unit area in the normal area NA.

In another aspect, as one example method for increasing the transmittance of at least one of the first optical area OA1 and the second optical area OA2, a pixel density differential design scheme may be applied as described above. According to the pixel density differential design scheme, the display panel 110 may be designed so that the number of subpixels per unit area of at least one of the first optical area OA1 and the second optical area OA2 is smaller than the number of subpixels per unit area of the normal area NA.

However, in some cases, as another method for increasing the transmittance of at least one of the first optical area OA1 and the second optical area OA2, a pixel size differential design scheme may be applied. According to the pixel size differential design scheme, the display panel 110 may be designed so that the number of subpixels per unit area of at least one of the first optical area OA1 and the second optical area OA2 is identical or similar to the number of subpixels per unit area of the normal area NA, and the size of each subpixel (i.e., the size of the emission area) disposed in at least one of the first optical area OA1 and the second optical area OA2 is smaller than the size of each subpixel SP (i.e., the size of the emission area) disposed in the normal area NA.

Hereinafter, for convenience of description, it is assumed in the following description that, of the two schemes (pixel density differential design scheme and pixel size differential design scheme) for increasing the transmittance of at least one of the first optical area OA1 and the second optical area OA2, the pixel density differential design scheme is applied. Accordingly, that the number of subpixels per unit area is small, as described below, may be an expression corresponding to the subpixel size being small in the pixel size differential design scheme, and that the number of subpixels per unit area is large may be an expression corresponding to the subpixel size being large in the pixel size differential design scheme.

The first optical area OA1 may have various shapes, such as a circle, an ellipse, a quadrangle, a hexagon, or an octagon. The second optical area OA2 may have various shapes, such as a circle, an ellipse, a square, a hexagon, or an octagon. The first optical area OA1 and the second optical area OA2 may have the same shape or different shapes.

As illustrated in FIG. 1C, where the first optical area OA1 and the second optical area OA2 touch or border each other, the combined optical area including the first optical area OA1 and the second optical area OA2 may have various shapes, such as a circle, an ellipse, a square, a hexagon, or an octagon. Hereinafter, for convenience of description, each of the first optical area OA1 and the second optical area OA2 is illustrated by way of example as having a circular shape.

In the display device 100 according to example embodiments of the present disclosure, if the first optical electronic device 11 that is not exposed externally and is hidden in a lower portion of the display panel 100 is a camera, the display device 100 according to example embodiments of the present disclosure may be referred to as a display to which under display camera (UDC) technology has been applied.

Accordingly, the display device 100 according to example embodiments of the present disclosure does not require a notch or camera hole for camera exposure to be formed in the display panel 110, thereby preventing a reduction in the display area DA. Thus, as there is no need to form a notch or camera hole for exposure of the camera in the display panel 110, the size of the bezel area may be reduced, and design restrictions may be freed, thereby increasing the degree of freedom in design.

In the display device 100 according to example embodiments of the present disclosure, although one or more optical electronic devices 11 and 12 are positioned to be hidden behind the display panel 110, the one or more optical electronic devices 11 and 12 may be able to normally perform predetermined functions by normally receiving light.

Further, in the display device 100 according to example embodiments of the present disclosure, although one or more optical electronic devices 11 and 12 are positioned to be hidden behind the display panel 110 and are positioned to overlap the display area DA, the one or more optical areas OA1 and OA2 overlapping the one or more optical electronic devices 11 and 12 in the display area DA may be capable of displaying normal images.

Since the above-mentioned first optical area OA1 is designed as a light transmittable area, the image display characteristics in the first optical area OA1 may differ from the image display characteristics in the normal area NA.

Further, in designing the first optical area OA1 to enhance the image display characteristics, the transmittance of the first optical area OA1 may be degraded.

Accordingly, example embodiments of the present disclosure propose a structure of the first optical area OA1 capable of enhancing light transmittance in the first optical area OA1 without causing an image quality deviation between the first optical area OA1 and the normal area NA.

Further, example embodiments of the present disclosure propose a structure of the second optical area OA2 capable of enhancing light transmittance in the second optical area OA2 and image quality in the second optical area OA2 for the second optical area OA2, as well as for the first optical area OA1.

Further, in the display device 100 according to example embodiments of the present disclosure, the first optical area OA1 and the second optical area OA2 may be similar in that they are light transmittable areas, but may differ in their uses. Therefore, in the display device 100 according to example embodiments of the present disclosure, the structure of the first optical area OA1 and the structure of the second optical area OA2 may be designed to differ from each other.

Figure 2:
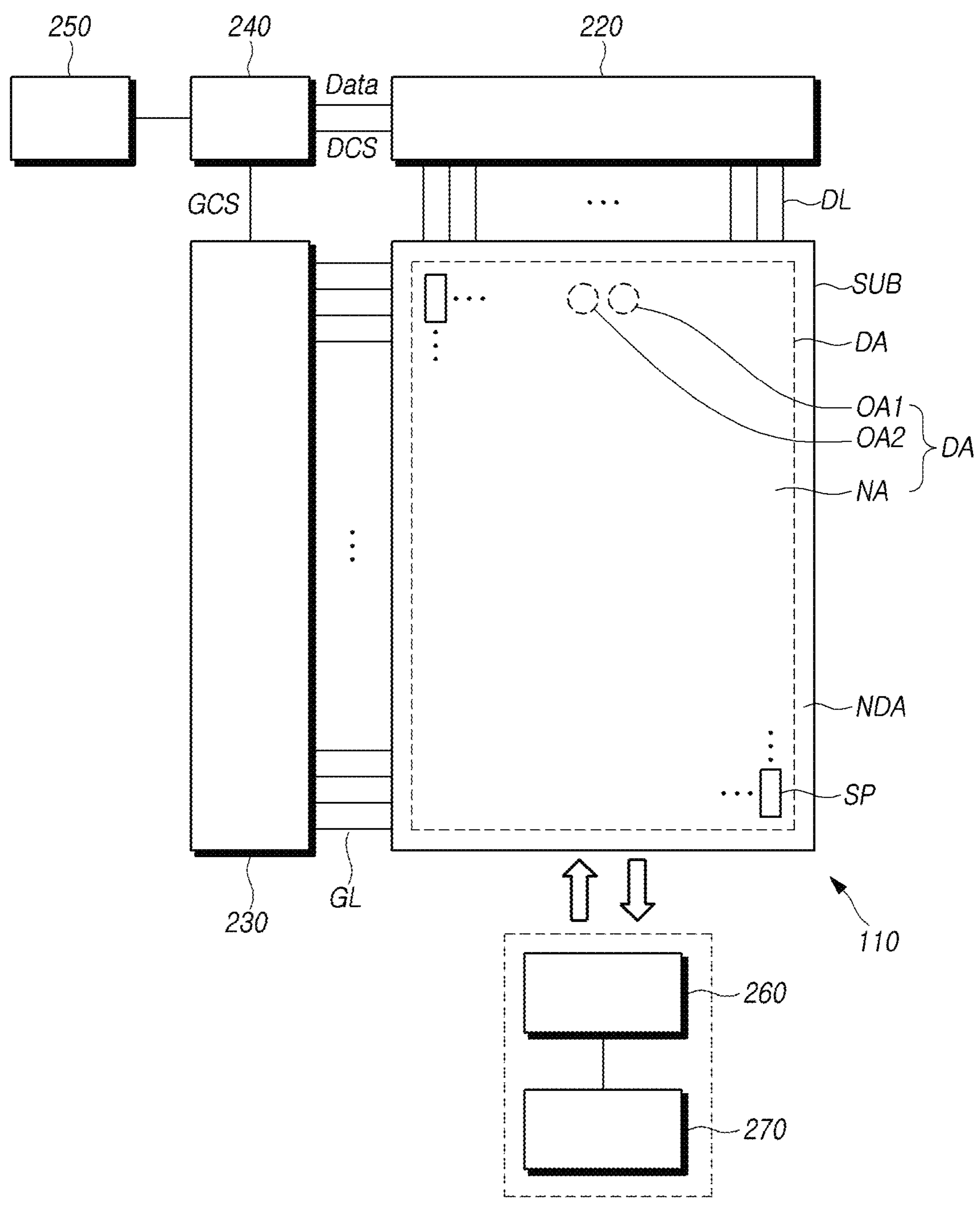
FIG. 2 is a view illustrating a system configuration of a display device according to example embodiments of the present disclosure.

FIG. 2 is a view illustrating a system configuration of a display device 100 according to example embodiments of the present disclosure.

As shown in FIG. 2, a display device 100 may include a display panel 110 and display driving circuits, as components for displaying images.

The display driving circuits are circuits for driving the display panel 110 and may include a data driving circuit 220, a gate driving circuit 230, and a display controller 240.

The display panel 110 may include a display area DA in which images are displayed and a non-display area NDA in which no image is displayed. The non-display area NDA may be an outer area of the display area DA and be referred to as a bezel area. The whole or part of the non-display area NDA may be an area visible from the front surface of the display device 100 or an area that is bent and not visible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to example embodiments of the present disclosure may be a liquid crystal display device or a self-emission display device in which the display panel 110 emits light by itself. Where the display device 100 according to example embodiments of the present disclosure is a self-emission display device, each of the plurality of subpixels SP may include a light emitting element. For example, the display device 100 according to example embodiments of the present disclosure may be an organic light emitting diode display in which the light emitting element is implemented as an organic light emitting diode (OLED). As another example, the display device 100 according to example embodiments of the present disclosure may be an inorganic light emitting display device in which the light emitting element is implemented as an inorganic material-based light emitting diode. As another example, the display device 100 according to example embodiments of the present disclosure may be a quantum dot display device in which the light emitting element is implemented as a quantum dot which is self-emission semiconductor crystal.

The structure of each of the plurality of subpixels SP may vary according to the type of the display device 100. For example, where the display device 100 is a self-emission display device in which the subpixels SP are configured to emit light by themselves, each subpixel SP may include a light emitting element that is configured to emit light by itself, one or more transistors, and one or more capacitors.

For example, various types of signal lines may include a plurality of data lines DL transferring data signals (also referred to as data voltages or image signals) and a plurality of gate lines GL transferring gate signals (also referred to as scan signals).

The plurality of data lines DL and the plurality of gate lines GL may cross each other. Each of the plurality of data lines DL may be disposed to extend in a first direction. Each of the plurality of gate lines GL may be disposed to extend in a second direction. Here, the first direction may be a column direction, and the second direction may be a row direction, but the present disclosure is not limited to this example. The first direction may be the row direction, and the second direction may be the column direction.

The data driving circuit 220 is a circuit for driving the plurality of data lines DL and may output data signals to the plurality of data lines DL. The gate driving circuit 230 is a circuit for driving the plurality of gate lines GL and may output gate signals to the plurality of gate lines GL.

The display controller 240 is a device for controlling the data driving circuit 220 and the gate driving circuit 230 and may control driving timings for the plurality of data lines DL and for the plurality of gate lines GL.

The display controller 240 may supply a data driving control signal DCS to the data driving circuit 220 to control the data driving circuit 220 and may supply a gate driving control signal GCS to the gate driving circuit 230 to control the gate driving circuit 230.

The display controller 240 may receive input image data from the host system 250 and may supply digital image data Data to the data driving circuit 220 based on the input image data.

The data driving circuit 220 may receive digital image data Data from the display controller 240, may convert the received digital image data Data into analog data signals, and may output the analog data signals to the plurality of data lines DL.

The gate driving circuit 230 may receive a first gate voltage corresponding to a turn-on level voltage and a second gate voltage corresponding to a turn-off level voltage, along with various gate driving control signals GCS, may then generate gate signals, and may supply the generated gate signals to the plurality of gate lines GL.

For example, the data driving circuit 220 may be connected with the display panel 110 by a tape automated bonding (TAB) method, may be connected to a bonding pad of the display panel 110 by a chip on glass (COG) or chip on panel (COP) method, or may be implemented by a chip on film (COF) method and connected with the display panel 110.

The gate driving circuit 230 may be connected with the display panel 110 by a TAB method, may be connected to a bonding pad of the display panel 110 by a COG or COP method, or may be connected with the display panel 110 according to a COF method. Alternatively, the gate driving circuit 230 may be formed in a gate in panel (GIP) type, in the non-display area NDA of the display panel 110. The gate driving circuit 230 may be disposed on the substrate or may be connected to the substrate. In other words, the gate driving circuit 230 of a GIP type may be disposed in the non-display area NDA of the substrate. The gate driving circuit 230 of a chip-on-glass (COG) type or chip-on-film (COF) type may be connected to the substrate.

In another aspect, at least one of the data driving circuit 220 and the gate driving circuit 230 may be disposed in the display area DA of the display panel 110. For example, at least one of the data driving circuit 220 and the gate driving circuit 230 may be disposed not to overlap the subpixels SP or to overlap all or some of the subpixels SP.

The data driving circuit 220 may be connected to one side (e.g., an upper or lower side) of the display panel 110. Depending on the driving scheme or the panel design scheme, data driving circuits 220 may be connected with both the sides (e.g., both the upper and lower sides) of the display panel 110 or with two or more of the four sides of the display panel 110.

The gate driving circuit 230 may be connected to one side (e.g., a left or right side) of the display panel 110. Depending on the driving scheme or the panel design scheme, gate driving circuits 230 may be connected with both the sides (e.g., both the left and right sides) of the display panel 110 or with two or more of the four sides of the display panel 110.

The display controller 240 may be implemented as a separate component from the data driving circuit 220, or the display controller 240 and the data driving circuit 220 may be integrated into an integrated circuit (IC).

The display controller 240 may be a timing controller used in typical display technology, a control device that may perform other control functions as well as the functions of the timing controller, or a control device other than the timing controller, or may be a circuit in the control device. The display controller 240 may be implemented as various circuits or electronic components, such as an integrated circuit (IC), a field programmable gate array (FPGA), an application specific integrated circuit (ASIC), or a processor.

The display controller 240 may be mounted on a printed circuit board or a flexible printed circuit and may be electrically connected with the data driving circuit 220 and the gate driving circuit 230 through the printed circuit board or the flexible printed circuit.

The display controller 240 may transmit/receive signals to/from the data driving circuit 220 according to one or more predetermined interfaces. The one or more interfaces may include, e.g., a low voltage differential signaling (LVDS) interface, an embedded clock point-point interface (EPI) interface, and a serial peripheral interface (SPI).

To provide a touch sensing function as well as an image display function, the display device 100 according to example embodiments of the present disclosure may include a touch sensor and a touch sensing circuit that are configured to detect whether a touch occurs by a touch object, such as a finger or pen, or the position of the touch.

The touch sensing circuit may include a touch driving circuit 260 that is configured to drive and sense the touch sensor and to generate and output touch sensing data. The touch sensing may also include a touch controller 270 that may detect an occurrence of a touch or the position of the touch using touch sensing data.

The touch sensor may include a plurality of touch electrodes. The touch sensor may further include a plurality of touch lines for electrically connecting the plurality of touch electrodes and the touch driving circuit 260.

The touch sensor may be present in a touch panel form outside the display panel 110 or may be integrated within the display panel 110. Where the touch panel, in the form of a touch panel external to the display panel 110, the touch panel may be referred to as an external type. Where the touch sensor is of the external type, the touch panel and the display panel 110 may be separately manufactured or may be combined during an assembly process. The external-type touch panel may include a touch panel substrate and a plurality of touch electrodes on the touch panel substrate.

Where the touch sensor is integrated within the display panel 110, the touch sensor may be formed on the substrate SUB, together with signal lines and electrodes related to display driving, during the manufacturing process of the display panel 110.

The touch driving circuit 260 may supply a touch driving signal to at least one of the plurality of touch electrodes and may sense at least one of the plurality of touch electrodes to generate touch sensing data.

The touch sensing circuit may perform touch sensing in a self-capacitance sensing scheme or a mutual-capacitance sensing scheme.

Where the touch sensing circuit performs touch sensing in the self-capacitance sensing scheme, the touch sensing circuit may perform touch sensing based on capacitance between each touch electrode and the touch object (e.g., a finger or pen). According to the self-capacitance sensing scheme, each of the plurality of touch electrodes may serve both as a driving touch electrode and as a sensing touch electrode. The touch driving circuit 260 may drive all or some of the plurality of touch electrodes and sense all or some of the plurality of touch electrodes.

Where the touch sensing circuit performs touch sensing in the mutual-capacitance sensing scheme, the touch sensing circuit may perform touch sensing based on capacitance between the touch electrodes. According to the mutual-capacitance sensing scheme, the plurality of touch electrodes may be divided into driving touch electrodes and sensing touch electrodes. The touch driving circuit 260 may drive the driving touch electrodes and sense the sensing touch electrodes.

The touch driving circuit 260 and the touch controller 270 included in the touch sensing circuit may be implemented as separate devices or as a single device. The touch driving circuit 260 and the data driving circuit 220 may be implemented as separate devices or as a single device.

The display device 100 may further include a power supply circuit for supplying various types of power to the display driver integrated circuit and/or the touch sensing circuit.

The display device 100 according to example embodiments of the present disclosure may be a mobile terminal, such as a smart phone or a tablet, or a monitor or television (TV) in various sizes, but the present disclosure is not limited such example devices. For example, the display device 100 may be a display in various types and various sizes capable of displaying information or images.

As described above, the display area DA in the display panel 110 may include the normal area NA and one or more optical areas OA1 and OA2. The normal area NA and one or more optical areas OA1 and OA2 are areas capable of displaying an image. However, the normal area NA may be an area where a light transmission structure is not required to be formed, and one or more optical areas OA1 and OA2 may be areas in which a light transmission structure is to be formed.

As described above, the display area DA in the display panel 110 may include one or more optical areas OA1 and OA2 together with the normal area NA. For convenience of description, the display area DA discussed below may include one optical area (OA or OA1) in some examples (see, e.g., FIG. 1A) and may include the first optical area OA1 and the second optical area OA2 in other examples (see, e.g., FIGS. 1B and 1C).

Figure 3:
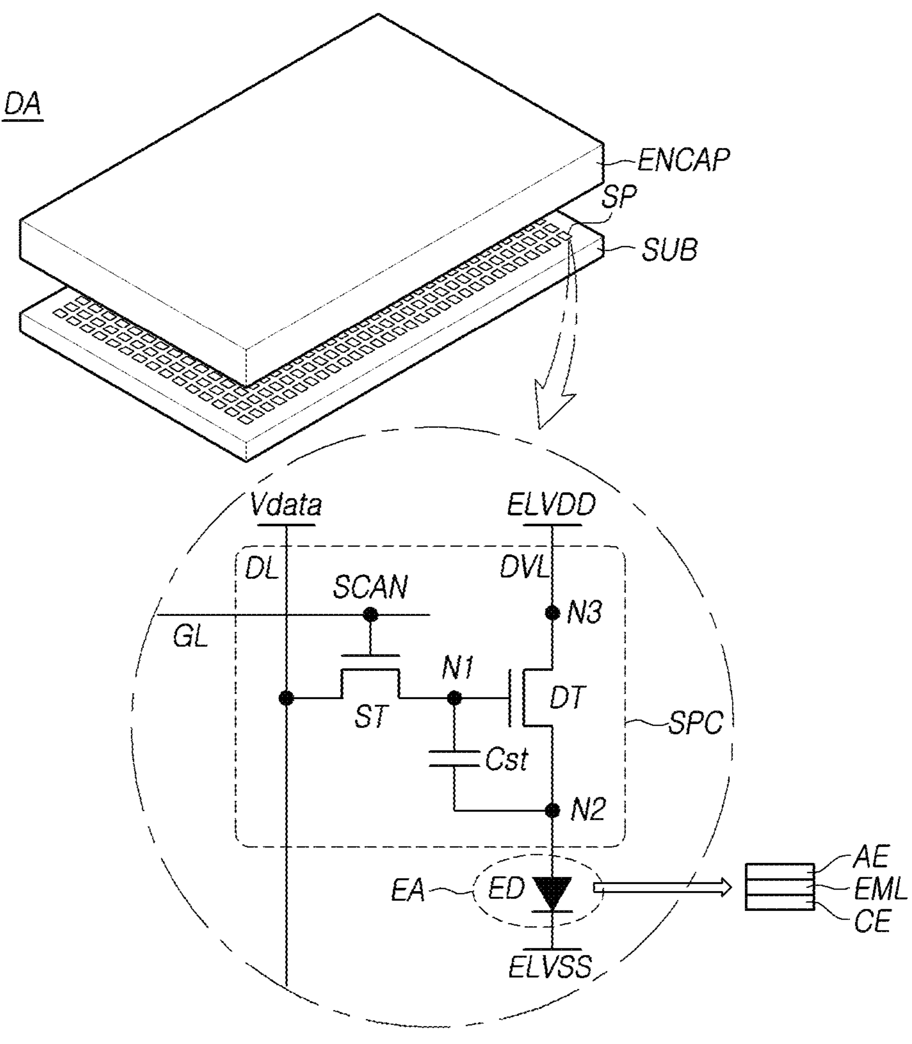
FIG. 3 is a view schematically illustrating a display panel according to example embodiments of the present disclosure.

FIG. 3 is a view schematically illustrating a display panel 110 according to example embodiments of the present disclosure.

As illustrated in FIG. 3, a plurality of subpixels SP may be disposed in the display area DA of the display panel 110. The plurality of subpixels SP may be disposed in the normal area NA and in the first optical area OA1 and the second optical area OA2 included in the display area DA.

As illustrated in FIG. 3, each of the plurality of subpixels SP may include a light emitting element ED and a subpixel circuit unit SPC configured to drive the light emitting element ED.

As shown in FIG. 3, the subpixel circuit unit SPC may include a driving transistor DT for driving the light emitting element ED, a scan transistor ST for transferring the data voltage Vdata to the first node N1 of the driving transistor DT, and a storage capacitor Cst for maintaining a constant voltage during one frame.

The driving transistor DT may include the first node N1 to which the data voltage may be applied, a second node N2 electrically connected with the light emitting element ED, and a third node N3 to which a driving voltage ELVDD may be applied from a driving voltage line DVL. The first node N1 in the driving transistor DT may be a gate node, the second node N2 may be one of a source node and a drain node, and the third node N3 may be the other of the source node and the drain node. For convenience of description, described below is an example in which the first node N1 in the driving transistor DT is a gate node, the second node N2 is a source node, and the third node N3 is a drain node.

The light emitting element ED may include an anode electrode AE, a light emitting layer EML, and a cathode electrode CE. The anode electrode AE may be a pixel electrode disposed in each subpixel SP and be electrically connected to the second node N2 of the driving transistor DT of each subpixel SP. The cathode electrode CE may be a common electrode commonly disposed in the plurality of subpixels SP, and a base voltage ELVSS may be applied thereto.

For example, the anode electrode AE may be a pixel electrode, and the cathode electrode CE may be a common electrode. Conversely, the anode electrode AE may be a common electrode, and the cathode electrode CE may be a pixel electrode. Hereinafter, for convenience of description, the anode electrode AE is a pixel electrode, and the cathode electrode CE is a common electrode in the examples discussed below.

The light emitting element ED may have a predetermined main emission area EA. The main emission area EA of the light emitting element ED may be defined as an area where the anode electrode AE, the light emitting layer EML, and the cathode electrode CE overlap one another.

For example, the light emitting element ED may be an organic light emitting diode (OLED), an inorganic light emitting diode, or a quantum dot light emitting element. Where the light emitting element ED is an organic light emitting diode, the light emitting layer EML of the light emitting element ED may include an organic light emitting layer EML including an organic material.

The scan transistor ST may be on/off controlled by a scan signal SCAN, which is a gate signal, applied via the gate line GL and be electrically connected between the first node N1 of the driving transistor DT and the data line DL.

The storage capacitor Cst may be electrically connected between the first node N1 and second node N2 of the driving transistor DT.

The subpixel circuit unit SPC may have a 2T (transistor) 1C (capacitor) structure which includes two transistors DT and ST and one capacitor Cst as shown in FIG. 3. In some cases, each subpixel SP may further include one or more additional transistors and/or one or more additional capacitors.

The capacitor Cst may be an external capacitor intentionally designed to be outside the driving transistor DT and not a parasite capacitor (e.g., Cgs or Cgd) which is an internal capacitor that may be present between the first node N1 and the second node N2 of the driving transistor DT. Each of the driving transistor DT and the scan transistor ST may be an n-type transistor or a p-type transistor.

Since the circuit elements (particularly, the light emitting element ED implemented as an organic light emitting diode (OLED) containing an organic material) in each subpixel SP are vulnerable to external moisture or oxygen, an encapsulation layer ENCAP may be disposed on the display panel 110 to prevent or reduce penetration of external moisture or oxygen into the circuit elements (particularly, the light emitting element ED). The encapsulation layer ENCAP may be disposed to cover the light emitting elements ED.

Figure 4:
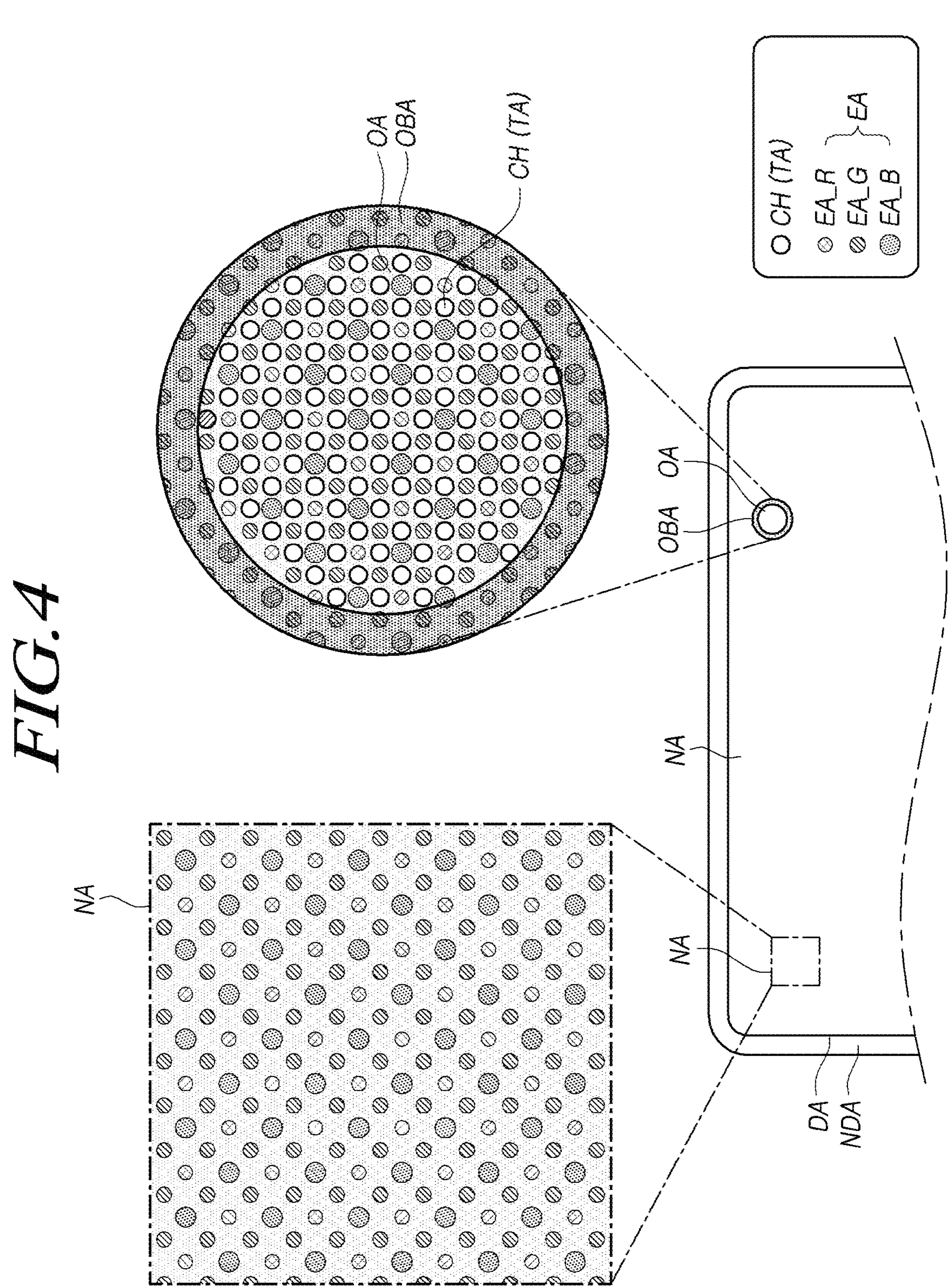
FIG. 4 schematically illustrates a normal area, a first optical bezel area, and a first optical area in a display panel according to example embodiments of the present disclosure.

FIG. 4 schematically illustrates a normal area NA, a first optical bezel area OBA1 (or OBA), and a first optical area OA1 (or OA) in a display panel according to embodiments of the disclosure.

As shown in FIG. 4, the display panel 110 according to example embodiments of the present disclosure may include a display area DA in which images are displayed and a non-display area NDA in which no image is displayed.

As illustrated in FIG. 4, the display area DA may include a first optical area OA1 (or OA), a first optical bezel area OBA1 (or OBA), and a normal area NA.

As shown in FIG. 4, the first optical area OA1 (or OA) may be an area overlapping the first optical electronic device 11 and may be a transmittable area through which light required for operation of the first optical electronic device 11 may pass. Here, the light passing through the first optical area OA1 (OA) may include light of a single wavelength band or may include light of various wavelength bands. For example, the light passing through the first optical area OA1 (OA) may include at least one of visible light, infrared light, or ultraviolet light. For example, where the first optical electronic device 11 is a camera, the light transmitted through the first optical area OA1 (OA) and used by the first optical electronic device 11 may include visible light. As another example, where the first optical electronic device 11 is an infrared sensor, the light transmitted through the first optical area OA1 (OA) and used in the first optical electronic device 11 may include infrared light (also referred to as infrared light beam or ray).

As illustrated in FIG. 4, the first optical bezel area OBA1 (or OBA) may be an area positioned outside the first optical area OA1 (OA). The normal area NA may be an area positioned outside the first optical bezel area OBA1 (OBA) and the first optical area OA1 (OA). The first optical bezel area OBA1 (OBA) may be disposed between the first optical area OA1 (OA) and the normal area NA.

For example, the first optical bezel area OBA1 (OBA) may be disposed only around a part of the perimeter of the first optical area OA1 (OA) or may be disposed around the entire perimeter of the first optical area OA1 (OA).

Where the first optical bezel area OBA1 (OBA) is disposed around the entire perimeter of the first optical area OA1 (OA), the first optical bezel area OBA1 (OBA) may have a ring shape surrounding the first optical area OA1 (OA).

For example, the first optical area OA1 (OA) may have various shapes, such as circular, elliptical, polygonal, or irregular shapes. The first optical bezel area OBA1 (OBA) may have various ring shapes (e.g., a circular ring shape, an elliptical ring shape, a polygonal ring shape, or an irregular ring shape) surrounding the first optical area OA1 (OA) having various corresponding shapes.

As shown in FIG. 4, the display area DA may include a plurality of main emission areas EA. Since the first optical area OA1 (OA), the first optical bezel area OBA1 (OBA), and the normal area NA are areas included in the display area DA, each of the first optical area OA1 (OA), the first optical bezel area OBA1 (OBA), and the normal area NA may each include a plurality of main emission areas EA.

For example, the plurality of main emission areas EA may include a first color emission area emitting light of a first color, a second color emission area emitting light of a second color, and a third color emission area emitting light of a third color.

At least one of the first color emission area, the second color emission area, and the third color emission area may have a different area from the rest in a plan view.

The first color, the second color, and the third color may be different colors and may be various colors. For example, the first color, the second color, and the third color may respectively include red, green, and blue.

Hereinafter, for convenience of description, examples in which the first color is red, the second color is green, and the third color is blue is discussed. However, the present disclosure is not limited thereto.

Where the first color is red, the second color is green, and the third color is blue, the area of the blue emission area EA_B may be the largest among the area of the red emission area EA_R, the area of the green emission area EA_G, and the area of the blue emission area EA_B.

The light emitting element ED disposed in the red emission area EA_R may include a light emitting layer EML emitting red light. The light emitting element ED disposed in the green emission area EA_G may include a light emitting layer EML emitting green light. The light emitting element ED disposed in the blue emission area EA_B may include a light emitting layer EML emitting blue light.

Among the light emitting layer EML emitting red light, the light emitting layer EML emitting green light, and the light emitting layer EML emitting blue light, an organic material included in the light emitting layer EML emitting blue light may be most easily deteriorated.

Where the area of the blue emission area EA_B is designed to be the largest, the density of the current supplied to the light emitting element ED disposed in the blue emission area EA_B may be the smallest. Accordingly, the degree of deterioration of the light emitting element ED disposed in the blue emission area EA_B may be similar to the degree of deterioration of the light emitting element ED disposed in the red emission area EA_R and the degree of deterioration of the light emitting element ED disposed in the green emission area EA_G.

Accordingly, the deterioration deviations among the light emitting element ED disposed in the red emission area EA_R, the light emitting element ED disposed in the green emission area EA_G, and the light emitting element ED disposed in the blue emission area EA_B may be prevented or reduced, thereby improving image quality. Further, the deterioration deviations among the light emitting element ED disposed in the red emission area EA_R, the light emitting element ED disposed in the green emission area EA_G, and the light emitting element ED disposed in the blue emission area EA_B may be prevented or reduced, thereby reducing the lifetime deviations among the light emitting element ED disposed in the red emission area EA_R, the light emitting element ED disposed in the green emission area EA_G, and the light emitting element ED disposed in the blue emission area EA_B.

As shown in FIG. 4, the first optical area OA1 (OA) may be a transmittable area having high light transmittance. To that end, the cathode electrode CE may include a plurality of cathode holes CH in the first optical area OA1 (OA). In other words, in the first optical area OA1 (OA), the cathode electrode CE may include a plurality of cathode holes CH.

As illustrated in FIG. 4, the cathode electrode CE does not include the cathode hole CH in the normal area NA. In other words, in the normal area NA, the cathode electrode CE does not include the cathode hole CH.

Further, the cathode electrode CE does not include the cathode hole CH in the first optical bezel area OBA1 (OBA). In other words, in the first optical bezel area OBA1 (OBA), the cathode electrode CE does not include the cathode hole CH.

In the first optical area OA1 (OA), the plurality of cathode holes CH formed in the cathode electrode CE may also be referred to as a plurality of first transmissive areas TA1 (or TA) or a plurality of light transmission openings. Here, in FIG. 4, one or more cathode holes CH may have a circular shape but is not limited thereto. For example, the cathode holes CH may have various shapes other than the circular shape, such as an elliptical shape, a polygonal shape, or an irregular shape.

Although not specifically illustrated in FIG. 4, the second optical area OA2 may be disposed adjacent to the first optical area OA1 (OA). The arrangement of the main emission areas EA in the second optical area OA2 is described in more detail with reference to FIG. 11.

Figure 5:
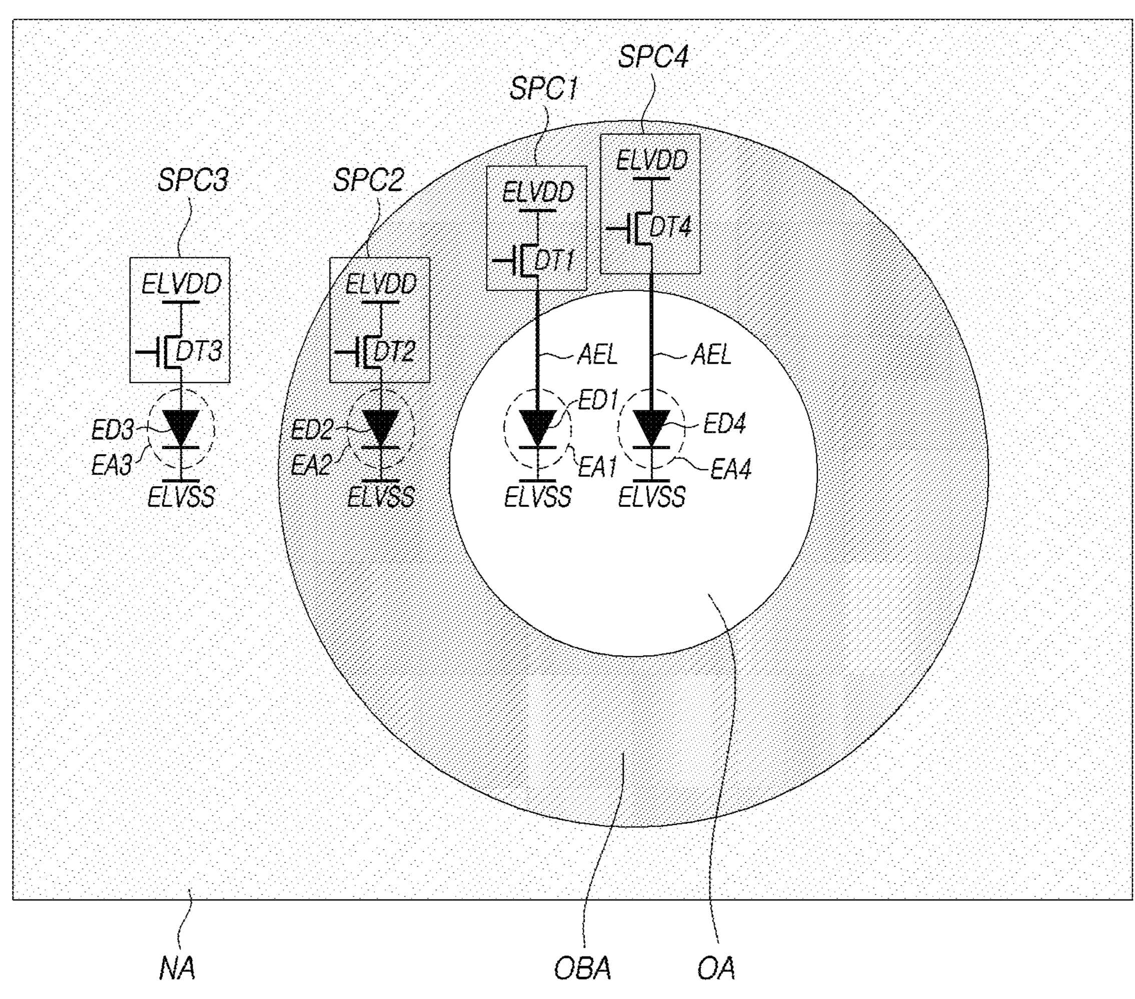
FIGS. 5 and 6 illustrate a light emitting element and a subpixel circuit unit for driving the light emitting element, disposed in each of a normal area, a first optical bezel area, and a first optical area, according to example embodiments of the present disclosure.

FIG. 5 illustrates, in the display panel 110 according to example embodiments of the present disclosure, light emitting devices ED1, ED2, ED3, and ED4 disposed respectively in the first optical area OA1 (OA), the first optical bezel area OBA1 (OBA), the normal area NA, and the first optical area OA1 (OA), and subpixel circuit units SPC1, SPC2, SPC3, and SPC4 for respectively driving the light emitting devices ED1, ED2, ED3, and ED4.

Each of the subpixel circuit units SPC1, SPC2, SPC3, and SPC4 may include transistors DT and ST and a storage capacitor Cst as shown in FIG. 3. However, for convenience of description, each of the subpixel circuit units SPC1, SPC2, SPC3, and SPC4 is briefly expressed below as having a driving transistor DT1, DT2, DT3, and DT4, respectively.

As illustrated in FIG. 5, the normal area NA, the first optical area OA1 (OA), and the first optical bezel area OBA1 (OBA) may have structural differences from one another as well as positional differences.

As a structural difference, the subpixel circuit units SPC1, SPC2, SPC3, and SPC4 may be disposed in the first optical bezel area OBA1 (OBA) or the normal area NA, but no subpixel circuit unit is disposed in the first optical area OA1 (OA). In other words, transistors DT1, DT2, DT3, and DT4 may be disposed in the first optical bezel area OBA1 (OBA) or the normal area NA, but no transistors are disposed in the first optical area OA1 (OA).

The transistors and storage capacitors included in the subpixel circuit units SPC1, SPC2, SPC3, and SPC4 are components that may reduce transmittance. Accordingly, as the subpixel circuit units SPC1, SPC2, SPC3, and SPC4 are not disposed in the first optical area OA1 (OA), the transmittance of the first optical area OA1 (OA) may be further increased.

The subpixel circuit units SPC1, SPC2, SPC3, and SPC4 are disposed only in the normal area NA and the first optical bezel area OBA1 (OBA), but the light emitting elements ED1, ED2, ED3, and ED4 may be disposed in the normal area NA, the first optical bezel area OBA1, and the first optical area OA1 (OA).

As shown in FIG. 5, the first light emitting element ED1 may be disposed in the first optical area OA1 (OA), but the first subpixel circuit unit SPC1 for driving the first light emitting element ED1 is not disposed in the first optical area OA1 (OA).

As shown in FIG. 5, the first subpixel circuit unit SPC1 for driving the first light emitting element ED1 disposed in the first optical area OA1 (OA) is not disposed in the first optical area OA1 (OA) but may be disposed in the first optical bezel area OBA1 (OBA).

Described below in greater detail are the normal area NA, the first optical area OA1, and the first optical bezel area OBA1.

As shown in FIG. 5, a plurality of main emission areas EA included in the display panel 110 according to example embodiments of the present disclosure may include a first emission area EA1, a second emission area EA2, and a third emission area EA3. Here, the first emission area EA1 may be included in the first optical area OA1 (OA). The second emission area EA2 may be included in the first optical bezel area OBA1 (OBA). The third emission area EA3 may be included in the normal area NA. Hereinafter, it is assumed that the first emission area EA1, the second emission area EA2, and the third emission area EA3 are emission areas of the same color.

As illustrated in FIG. 5, the display panel 110 according to example embodiments of the present disclosure may include a first light emitting element ED1 disposed in a first optical area OA1 (OA) and having a first emission area EA1, a second light emitting element ED2 disposed in a first optical bezel area OBA1 (OBA) and having a second emission area EA2, and a third light emitting element ED3 disposed in a normal area NA and having a third emission area EA3.

As shown in FIG. 5, the display panel 110 according to example embodiments of the present disclosure may further include a first subpixel circuit unit SPC1 configured to drive the first light emitting element ED1, a second subpixel circuit unit SPC2 configured to drive the second light emitting element ED2, and a third subpixel circuit unit SPC3 configured to drive the third light emitting element ED3.

As illustrated in FIG. 5, the first subpixel circuit unit SPC1 may include a first driving transistor DT1. The second subpixel circuit unit SPC2 may include a second driving transistor DT2. The third subpixel circuit unit SPC3 may include a third driving transistor DT3.

As illustrated in FIG. 5, in the display panel 110 according to example embodiments of the present disclosure, the second subpixel circuit unit SPC2 may be disposed in the first optical bezel area OBA1 (OBA) in which the corresponding second light emitting element ED2 is disposed, and the third subpixel circuit unit SPC3 may be disposed in the normal area NA in which the corresponding third light emitting element ED3 is disposed.

As shown in FIG. 5, in the display panel 110 according to example embodiments of the present disclosure, the first subpixel circuit unit SPC1 may not be disposed in the first optical area OA1 (OA) where the corresponding first light emitting element ED1 is disposed, but may be disposed in the first optical bezel area OBA1 (OBA) positioned outside the first optical area OA1 (OA). Accordingly, the transmittance of the first optical area OA1 (OA) may be increased, or may not be reduced by the first subpixel circuit unit SPC1.

As illustrated in FIG. 5, the display panel 110 according to example embodiments of the present disclosure may further include an anode extension line AEL that electrically connects the first subpixel circuit unit SPC1 disposed in the first optical bezel area OBA1 (OBA) and the first light emitting element ED1 disposed in the first optical area OA1 (OA).

The anode extension line AEL may electrically extend the anode electrode AE of the first light emitting element ED1 to the second node N2 (a source or drain node) of the first driving transistor DT1 in the first subpixel circuit unit SPC1.

As described above, in the display panel 110 according to example embodiments of the present disclosure, the first subpixel circuit unit SPC1 for driving the first light emitting element ED1 disposed in the first optical area OA1 (OA) may be disposed in the first optical bezel area OBA1 (OBA), and not in the first optical area OA1 (OA). Such a structure may also be referred to as an anode extension structure.

Where the display panel 110 according to example embodiments of the present disclosure has the anode extension structure, the whole or a portion of the anode extension line AEL may be disposed in the first optical area OA1 (OA), and the anode extension line AEL may include a transparent line. Accordingly, even when the anode extension line AEL connecting the first subpixel circuit unit SPC1 and the first light emitting element ED1 is disposed in the first optical area OA1 (OA), it is possible to prevent a decrease in transmittance.

As illustrated in FIG. 5, the plurality of main emission areas EA may further include a fourth emission area EA4 that is configured to emit light of the same color as the first emission area EA1 and is included in the first optical area OA1.

As shown in FIG. 5, the fourth emission area EA4 may be disposed adjacent to the first emission area EA1 in a row direction or a column direction.

As illustrated in FIG. 5, the display panel 110 according to example embodiments of the present disclosure may further include a fourth light emitting element ED4 disposed in the first optical area OA1 (OA) and having a fourth emission area EA4, and a fourth subpixel circuit unit SPC4 configured to drive the fourth light emitting element ED4.

As shown in FIG. 5, the fourth subpixel circuit unit SPC4 may include a fourth driving transistor DT4. For convenience of description, the scan transistor ST and the storage capacitor Cst included in the fourth subpixel circuit unit SPC4 are not illustrated in FIG. 5.

As shown in FIG. 5, the fourth subpixel circuit unit SPC4 is a circuit for driving the fourth light emitting element ED4 disposed in the first optical area OA1 (OA), but the fourth subpixel circuit unit SPC4 may be disposed in the first optical bezel area OBA1 (OBA).

As illustrated in FIG. 5, the display panel 110 according to example embodiments of the present disclosure may further include an anode extension line AEL that electrically connects the fourth subpixel circuit unit SPC4 and the fourth light emitting element ED4.

The whole or a portion of the anode extension line AEL may be disposed in the first optical area OA1 (OA), and the anode extension line AEL may include a transparent line.

As described above, the first subpixel circuit unit SPC1 disposed in the first optical bezel area OBA1 (OBA) may drive one light emitting element ED1 disposed in the first optical area OA1. This circuit unit connection scheme is called a one-to-one (1:1) circuit unit connection scheme.

Accordingly, the number of subpixel circuit units SPC disposed in the first optical bezel area OBA1 (OBA) may significantly increase. The structure of the first optical bezel area OBA1 (OBA) may become complicated, and the aperture ratio (or emission area) of the first optical bezel area OBA1 (OBA) may decrease.

To increase the aperture ratio (or emission area) of the first optical bezel area OBA1 (OBA) despite having the anode extension structure, the display device 100 according to example embodiments of the present disclosure may have a 1:N circuit unit connection scheme, where Nis an integer greater than or equal to 2).

According to the 1:N circuit unit connection scheme, the first subpixel circuit unit SPC1 disposed in the first optical bezel area OBA1 (OBA) may simultaneously drive two or more light emitting elements ED disposed in the first optical area OA1 (OA).

Figure 6:
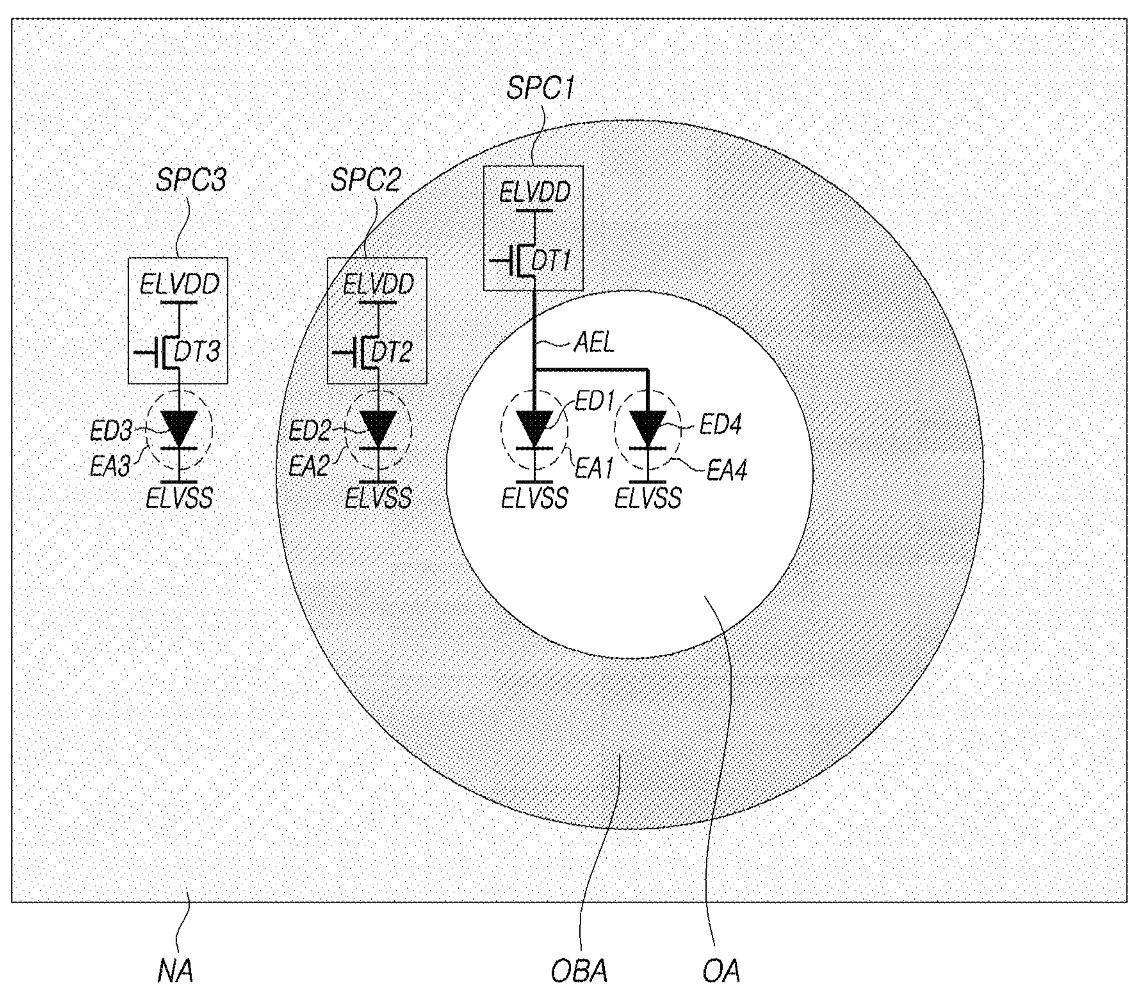

FIG. 6 illustrates an example in which, for convenience of description, a 1:2 circuit unit connection scheme is applied. That is, the first subpixel circuit unit SPC1 disposed in the first optical bezel area OBA1 (OBA) simultaneously drives two or more light emitting elements ED1 and ED4 disposed in the first optical area OA1 (OA).

FIG. 6 illustrates the light emitting elements ED1, ED2, ED3, and ED4 disposed in the normal area NA, the first optical bezel area OBA1, and the first optical area OA1, and subpixel circuit units SPC1, SPC2, and SPC3 for driving the light emitting elements ED1, ED2, ED3, and ED4 in the display panel 110 according to example embodiments of the present disclosure.

As shown in FIG. 6, the fourth light emitting element ED4 disposed in the first optical area OA1 (OA) may be driven by the first subpixel circuit unit SPC1 for driving the first light emitting element ED1 disposed in the first optical area OA1 (OA). In other words, the first subpixel circuit unit SPC1 disposed in the first optical bezel area OBA1 (OBA) may be configured to drive the first light emitting element ED1 and the fourth light emitting element ED4 disposed in the first optical area OA1 (OA) together.

Accordingly, although the display panel 110 has the anode extension structure, the number of subpixel circuit units SPC disposed in the first optical bezel area OBA1 (OBA) may be reduced compared to the 1:1 circuit unit connection scheme, thereby increasing the opening and emission areas in the first optical bezel area OBA1 (OBA).

In FIG. 6, the first light emitting element ED1 and the fourth light emitting element ED4 driven together by the first subpixel circuit unit SPC1 disposed in the first optical bezel area OBA1 (OBA) may be light emitting elements emitting light of the same color, and may be light emitting elements adjacent to each other in the row direction or the column direction.

As shown in FIG. 6, the anode extension line AEL may connect the first subpixel circuit unit SPC1 disposed in the first optical bezel area OBA1 (OBA) to the first light emitting element ED1 and the fourth light emitting element ED4 disposed in the first optical area OA1 (OA).

Figure 7:
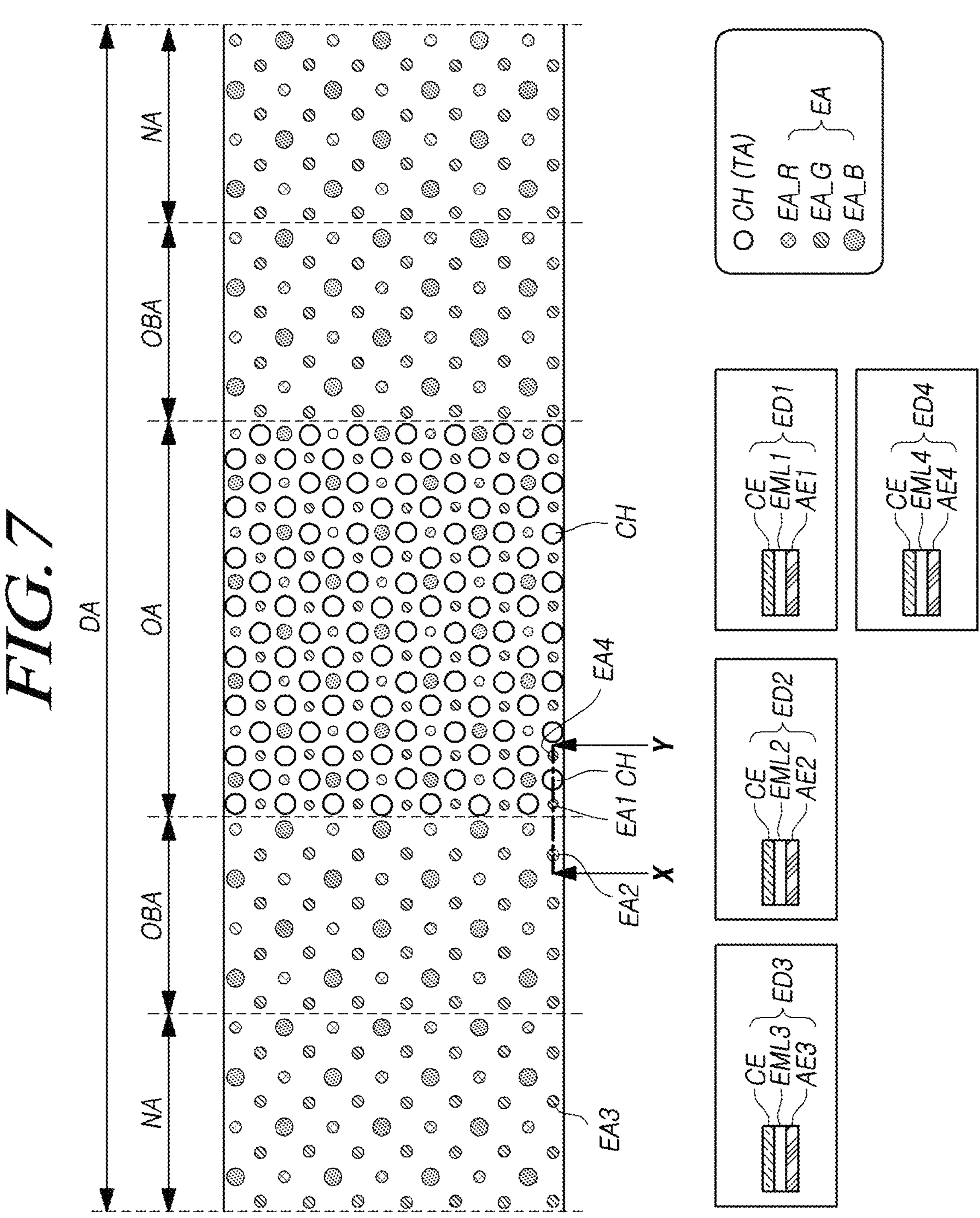
FIG. 7 is a plan view illustrating a normal area, an optical bezel area, and an optical area in a display panel according to example embodiments of the present disclosure.

FIG. 7 is a plan view illustrating a normal area NA, an optical bezel area OBA, and an optical area OA in a display panel according to example embodiments of the present disclosure.

As shown in FIG. 7, in the display panel 110 according to example embodiments of the present disclosure, the plurality of main emission areas EA disposed in each of the normal area NA, the optical bezel area OBA, and the optical area OA may include a red emission area EA_R, a green emission area EA_G, and a blue emission area EA_B.

As illustrated in FIG. 7, in the display panel 110 according to example embodiments of the present disclosure, the cathode electrode CE may be commonly disposed in the normal area NA, the optical bezel area OBA, and the optical area OA.

The cathode electrode CE may include a plurality of cathode holes CH, and the plurality of cathode holes CH of the cathode electrode CE may be disposed in the optical area OA.

The normal area NA and optical bezel area OBA may be an area where light is not transmissible, and the optical area OA may be an area where light is transmissible. Thus, the transmittance in the optical area OA may be higher than the transmittance in the optical bezel area OBA and normal area NA.

The entire optical area OA may be the area through which light may be transmitted, and the plurality of cathode holes CH within the optical area OA may be transmissive areas TA through which light may be better transmitted. In other words, the remaining area of the optical area OA except for the plurality of cathode holes CH may be an area through which light may be transmitted, and the transmittance of the plurality of cathode holes CH in the optical area OA may be higher than the transmittance of the remaining area of the optical area OA except for the plurality of cathode holes CH.

Alternatively, in another example embodiment, the plurality of cathode holes CH in the optical area OA may be the transmissive areas TA through which light may be transmitted, and the remaining area of the optical area OA except for the plurality of cathode holes CH may be an area where light is not transmitted.

As shown in FIG. 7, the arrangement of the main emission areas EA in the optical area OA, the arrangement of the main emission areas EA in the optical bezel area OBA, and the arrangement of the main emission areas EA in the normal area NA may be identical to each other.

As shown in FIG. 7, the plurality of main emission areas EAs may include a first emission area EA1 included in the optical area OA, a second emission area EA2 emitting light of the same color as the first emission area EA1 and included in an optical bezel area OBA, and a third emission area EA3 emitting light of the same color as the first emission area EA1 and included in the normal area NA.

As shown in FIG. 7, the plurality of main emission areas EA may further include a fourth emission area EA4 that emits light of the same color as the first emission area EA1 and is included in the optical area OA.

As shown in FIG. 7, the display panel 110 according to example embodiments of the present disclosure may include a first anode electrode AE1 disposed in the optical area OA, a second anode electrode AE2 disposed in the optical bezel area OBA, a third anode electrode AE3 disposed in the normal area NA, and a fourth anode electrode AE4 disposed in the optical area OA.

The display panel 110 according to example embodiments of the present disclosure may further include a cathode electrode CE disposed in common in the normal area NA, the optical bezel area OBA, and the optical area OA.

The display panel 110 according to example embodiments of the present disclosure may include a first light emitting layer EML1 disposed in the optical area OA, a second light emitting layer EML2 disposed in the optical bezel area OBA, a third light emitting layer EML3 disposed in the normal area NA, and a fourth light emitting layer EML4 disposed in the optical area OA.

The first to the fourth light emitting layers EML1 to EML4 may be light emitting layers that emit light of the same color. In this case, the first to the fourth light emitting layers EML1 to EML4 may be separately disposed or may be integrated as one layer.

As shown in FIG. 7, the first light emitting element ED1 may be formed by the first anode electrode AE1, the first light emitting layer EML1, and the cathode electrode CE. The second light emitting element ED2 may be formed by the second anode electrode AE2, the second light emitting layer EML2, and the cathode electrode CE. The third light emitting element ED3 may be formed by the third anode electrode AE3, the third light emitting layer EML3, and the cathode electrode CE. The fourth light emitting element ED4 may be formed by the fourth anode electrode AE4, the fourth light emitting layer EML4, and the cathode electrode CE.

Hereinafter, the cross-sectional structure taken along the X-Y line of FIG. 7 is described in more detail with reference to FIGS. 8 and 9.

The portion of FIG. 7 taken along line X-Y of FIG. 7 includes a portion of the optical bezel area OBA and a portion of the optical area OA with respect to the boundary between the optical bezel area OBA and the optical area OA.

The portion taken along line X-Y of FIG. 7 may include the first emission area EA1 and the fourth emission area EA4 included in the optical area OA, and the second emission area EA2 included in the optical bezel area OBA. The first emission area EA1, fourth emission area EA4, and second emission area EA2 are examples of emission areas EAs that emit the same color of light.

Figure 8:
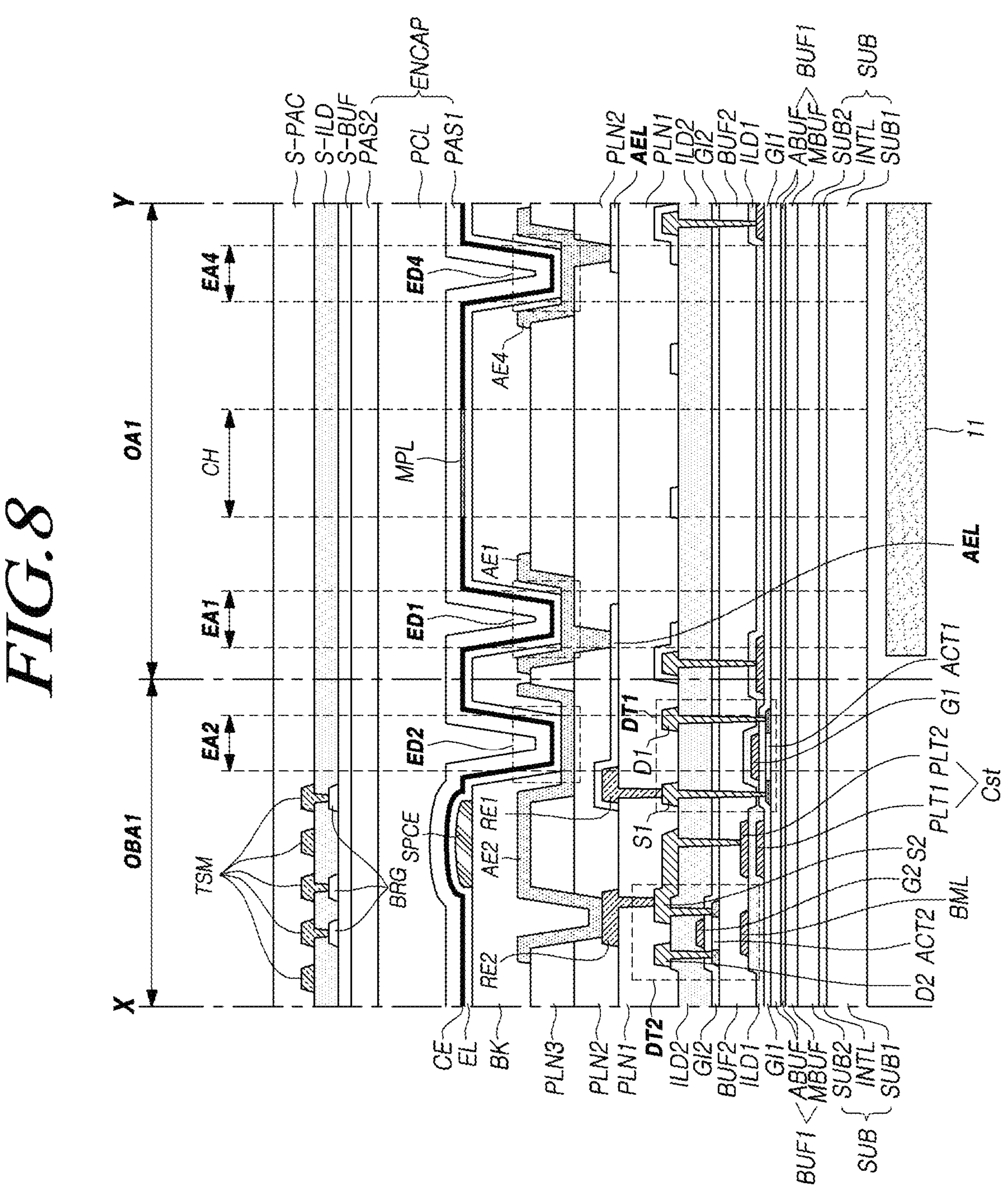
FIGS. 8 and 9 are example cross-sectional views illustrating a first optical bezel area and a first optical area of a display panel according to example embodiments of the present disclosure.

FIG. 8 is an example cross-sectional view illustrating a display panel 110, e.g., the optical bezel area OBA (OBA1) and the optical area OA (OA1) of the display panel 110 according to example embodiments of the present disclosure. However, FIG. 8 is an example cross-sectional view where the 1:1 circuit connection scheme is applied as in FIG. 5.

As shown in FIG. 8, when viewed in a vertical structure, the display panel 110 may include a transistor forming part, a light emitting element forming part, and an encapsulation part.

The transistor forming part may include a substrate SUB, a first buffer layer BUF1 on the substrate SUB, and various transistors DT1 and DT2, storage capacitor Cst, and various electrodes or signal lines formed on the first buffer layer BUF1.

The substrate SUB may include a first substrate SUB1 and a second substrate SUB2. An intermediate film INTL may be present between the first and second substrates SUB1 and SUB2. For example, the intermediate film INTL may be an inorganic film and may block moisture penetration.

A lower shield metal (not illustrated) may be disposed on the substrate SUB. The lower shield metal may be positioned under the first active layer ACT1 of the first driving transistor DT1.

The first buffer layer BUF1 may be a single film or multi-film structure. Where the first buffer layer BUF1 is formed in a multi-film structure, the first buffer layer BUF1 may include a multi-buffer layer MBUF and an active buffer layer ABUF.

Various transistors DT1 and DT2, storage capacitor Cst, and various electrodes or signal lines may be formed on the first buffer layer BUF1.

For example, the transistors DT1 and DT2 formed on the first buffer layer BUF1 may be formed of the same materials and on the same underlying layer. Alternatively, as illustrated in FIG. 8, among the transistors DT1 and DT2, the first driving transistor DT1 and the second driving transistor DT2 may be formed of different materials and may be positioned on different layers.

As shown in FIG. 8, the first driving transistor DT1 may be a driving transistor DT for driving the first light emitting element ED1 included in the optical area OA (OA1), and the second driving transistor DT2 may be a driving transistor DT for driving the second light emitting element ED2 included in the optical bezel region OBA (OBA1).

In other words, the first driving transistor DT1 may be a driving transistor included in the first pixel circuit SPC1 for driving the first light emitting element ED1 included in the optical area OA (OA1), and the second driving transistor DT2 may be a driving transistor included in the second pixel circuit SPC2 for driving the second light emitting element ED2 included in the optical bezel area OBA (OBA1).

An example formation of the first driving transistor DT1 and the second driving transistor DT2 is described below in more detail.

The first driving transistor DT1 may include a first active layer ACT1, a first gate electrode G1, a first source electrode S1, and a first drain electrode D1.

The second driving transistor DT2 may include a second active layer ACT2, a second gate electrode G2, a second source electrode S2, and a second drain electrode D2.

The second active layer ACT2 of the second driving transistor DT2 may be positioned higher than (or above) the first active layer ACT1 of the first driving transistor DT1.

A first buffer layer BUF1 may be disposed under the first active layer ACT1 of the first driving transistor DT1, and a second buffer layer BUF2 may be disposed under the second active layer ACT2 of the second driving transistor DT2.

In other words, the first active layer ACT1 of the first driving transistor DT1 may be positioned on the first buffer layer BUF1, and the second active layer ACT2 of the second driving transistor DT2 may be positioned on the second buffer layer BUF2. Here, the second buffer layer BUF2 may be positioned higher than (or above) the first buffer layer BUF1.

The first active layer ACT1 of the first driving transistor DT1 may be disposed on the first buffer layer BUF1, and a first gate insulation film GI1 may be formed on the first active layer ACT1 of the first driving transistor DT1. The first gate electrode G1 of the first driving transistor DT1 may be disposed on the first gate insulation film GI1, and a first inter-layer insulation film ILD1 may be disposed on the first gate electrode G1 of the first driving transistor DT1.

Here, the first active layer ACT1 of the first driving transistor DT1 may include a first channel area overlapping the first gate electrode G1, a first source connection area positioned on one side of the first channel area, and a first drain connection area positioned on the other side of the channel area.

A second buffer layer BUF2 may be disposed on the first inter-layer insulation film ILD1.

The second active layer ACT2 of the second driving transistor DT2 may be disposed on the second buffer layer BUF2, and a second gate insulation film GI2 may be disposed on the second active layer ACT2. The second gate electrode G2 of the second driving transistor DT2 may be disposed on the second gate insulation film GI2, and a second inter-layer insulation film ILD2 may be disposed on the second gate electrode G2.

Here, the second active layer ACT2 of the second driving transistor DT2 may include a second channel area overlapping the second gate electrode G2, a second source connection area positioned on one side of the second channel area, and a second drain connection area positioned on the other side of the channel area.

The first source electrode S1 and the first drain electrode D1 of the first driving transistor DT1 may be disposed on the second inter-layer insulation film ILD2. The second source electrode S2 and the second drain electrode D2 of the second driving transistor DT2 may be disposed on the second inter-layer insulation film ILD2.

The first source electrode S1 and the first drain electrode D1 of the first driving transistor DT1 may be connected with the first source connection area and the first drain connection area, respectively, of the first active layer ACT1 via the through holes in the second inter-layer insulation film ILD2, the second gate insulation film GI2, the second buffer layer BUF2, the first inter-layer insulation film ILD1, and the first gate insulation film GI1.

The second source electrode S2 and the second drain electrode D2 of the second driving transistor DT2 may be connected with the second source connection area and the second drain connection area, respectively, of the second active layer ACT2 via the through holes in the second inter-layer insulation film ILD2 and the second gate insulation film GI2.

In FIG. 8, only the second driving transistor DT2 and the storage capacitor Cst included in the second pixel circuit SPC2 are shown for illustrative purposes, with other transistors omitted. In FIG. 8, only the first driving transistor DT1 included in the first pixel circuit SPC1 is shown for illustrative purposes, with other transistors and storage capacitor omitted.

As shown in FIG. 8, the storage capacitor Cst included in the second pixel circuit SPC2 may include a first capacitor electrode PLT1 and a second capacitor electrode PLT2.

The first capacitor electrode PLT1 may be electrically connected to the second gate electrode G2 of the second driving transistor DT2, and the second capacitor electrode PLT2 may be electrically connected to the second source electrode S2 of the second driving transistor DT2. In another aspect, as shown in FIG. 8, a lower metal BML may be disposed under the second active layer ACT2 of the second driving transistor DT2. The lower metal BML may overlap the whole or part of the second active layer ACT2.

For example, the lower metal BML may be electrically connected to the second gate electrode G2. As another example, the lower metal BML may serve as a light shield to block the light introduced from thereunder (e.g., through the substrate SUB). In this case, the lower metal BML may be electrically connected to the second source electrode S2.

The first driving transistor DT1 is a transistor for driving the first light emitting element ED1 disposed in the optical area OA but may be disposed in the optical bezel area OBA.

The second driving transistor DT2 is a transistor for driving the second light emitting element ED2 disposed in the optical bezel area OBA and may be disposed in the optical bezel area OBA.

As shown in FIG. 8, a first planarization layer PLN1 may be disposed on the first driving transistor DT1 and the second driving transistor DT2. In other words, the first planarization layer PLN1 may be disposed on the first source electrode S1 and the first drain electrode D2 of the first driving transistor DT1 and on the second source electrode S2 and the second drain electrode D2 of the second driving transistor DT2.

As shown in FIG. 8, a first relay electrode RE1 and a second relay electrode RE2 may be disposed on the first planarization layer PLN1.

Here, the first relay electrode RE1 may be an electrode that relays an electrical connection between the first source electrode S1 of the first driving transistor DT1 and the first anode electrode AE1 of the first light emitting element ED1. The second relay electrode RE2 may be an electrode that relays an electrical connection between the second source electrode S2 of the second driving transistor DT2 and the second anode electrode AE2 of the second light emitting element ED2.

The first relay electrode RE1 may be electrically connected to the first source electrode S1 of the first driving transistor DT1 through a hole in the first planarization layer PLN1. The second relay electrode RE2 may be electrically connected to the second source electrode S2 of the second driving transistor DT2 through another hole in the first planarization layer PLN1.

As shown in FIG. 8, the first relay electrode RE1 and the second relay electrode RE2 may be disposed in the optical bezel area OBA.

In another aspect, As shown in FIG. 8, the anode extension line AEL may be connected to the first relay electrode RE1 and may extend from the optical bezel area OBA to the optical area OA.

As shown in FIG. 8, the anode extension line AEL may be a metal layer formed on the first relay electrode RE1 and may be formed of a transparent material.

As shown in FIG. 8, a second planarization layer PLN2 may be disposed covering the first relay electrode RE1, the second relay electrode RE2, and the anode extension line AEL. A third planarization layer PLN3 may be disposed on the second planarization layer PLN2.

As shown in FIG. 8, a light emitting element forming part may be positioned on the third planarization layer PLN3.

As shown in FIG. 8, the light emitting element forming part may include a first light emitting element ED1, a second light emitting element ED2, and a fourth light emitting element ED4 formed on the third planarization layer PLN3.

As shown in FIG. 8, the first light emitting element ED1 and the fourth light emitting element ED4 may be disposed in the optical area OA (OA1), and the second light emitting element ED2 may be disposed in the optical bezel area OBA (OBA1).

In the example of FIG. 8, the first light emitting element ED1, the second light emitting element ED2, and the fourth light emitting element ED4 may be light emitting elements emitting light of the same color.

As shown in FIG. 8, the first light emitting element ED1 may be formed in an area where the first anode electrode AE1, the light emitting element intermediate layer EL, and the cathode electrode CE overlap. The second light emitting element ED2 may be formed in an area where the second anode electrode AE2, the light emitting element intermediate layer EL, and the cathode electrode CE overlap. The fourth light emitting element ED4 may be formed in an area where the fourth anode electrode AE4, the light emitting element intermediate layer EL, and the cathode electrode CE overlap.

In the region where the first light emitting element ED1 is configured, the light emitting element intermediate layer EL may include a first common intermediate layer (not illustrated), a first light emitting layer EML1, and a second common intermediate layer (not illustrated). In the region where the second light emitting element ED2 is configured, the light emitting element intermediate layer EL may include the first common intermediate layer, a second light emitting layer EML2 and the second common intermediate layer. In the area where the fourth light emitting element ED4 is configured, the light emitting element intermediate layer EL may include the first common intermediate layer, a fourth light emitting layer EML4 and the second common intermediate layer.

The first common intermediate layer may be commonly positioned between the first, second, and fourth anode electrodes AE1, AE2, and AE4 and the first, second, and fourth light emitting layers EML1, EML2, and EML4 and may be disposed throughout the display area DA. The second common intermediate layer may be commonly positioned between the first, second, and fourth light emitting layers EML1, EML2, and EML4 and the cathode electrode CE and may be disposed throughout the display area DA.

The first common intermediate layer may include a hole injection layer (HIL) and a hole transfer layer (HTL). The second common intermediate layer may include an electron transfer layer (ETL) and an electron injection layer (EIL). The hole injection layer (HIL) may inject holes from the first, second, and fourth anode electrodes AE1, AE2, and AE4 into the hole transport layer, and the hole transport layer (HTL) may transport holes to the first, second, and fourth light emitting layers EML1, EML2, and EML4. The electron injection layer (EIL) may inject electrons from the cathode electrode (CE) into the electron transport layer, and the electron transport layer (ETL) may transport electrons to the first, second, and fourth light-emitting layers EML1, EML2, and EML4 (see, e.g., FIG. 7; not illustrated in FIG. 8).

As shown in FIG. 8, the first anode electrode AE1, the second anode electrode AE2, and the fourth anode electrode AE4 may be disposed on the third planarization layer PLN3. To configure the first, second, and fourth light emitting elements ED1, ED2, and ED4, the third planarization layer PLN3 may include first, second, and fourth light-emitting holes formed at positions corresponding to the first, second, and fourth emission areas EA1, EA2, and EA4.

The second anode electrode AE2 may be connected to the second relay electrode RE2 through a hole in the third planarization layer PLN3 and the second planarization layer PLN2. In a region of the third planarization layer PLN3 where the second emission hole exists, the second anode electrode AE2 may be disposed along an inclined surface of the third planarization layer PLN3. Accordingly, the viewing angle in the second emission area EA2 may be improved.

The first anode electrode AE1 may be connected to the anode extension line AEL extending from the optical bezel area OBA (OBA1) to the optical area OA (OA1) through another hole in the third planarization layer PLN3 and the second planarization layer PLN2. In a region of the third planarization layer PLN3 where the second emission hole exists, the first anode electrode AE1 may be disposed along an inclined surface of the third planarization layer PLN3. Accordingly, the viewing angle in the first emission area EA1 may be improved.

The fourth anode electrode AE4 may be connected to another anode extension line AEL extending from the optical bezel area OBA to the optical area OA through another hole in the second planarization layer PLN2. In a region of the third planarization layer PLN3 where the second emission hole exists, the fourth anode electrode AE4 may be disposed along an inclined surface of the third planarization layer PLN3. Accordingly, the viewing angle in the fourth emission area EA4 may be improved.

As shown in FIG. 8, a bank BK may be disposed on the first anode electrode AE1, the second anode electrode AE2, and the fourth anode electrode AE4. The bank BK may be disposed in some of the light emitting holes of the third planarization layer PLN3.

The bank BK may include a plurality of bank holes. The respective portions of the first anode electrode AE1, the second anode electrode AE2, and the fourth anode electrode AE4 may be exposed through the plurality of bank holes. In other words, the plurality of bank holes formed in the bank BK may overlap the respective portions of the first anode electrode AE1, the second anode electrode AE2, and the fourth anode electrode AE4.

As shown in FIG. 8, a light emitting element intermediate layer EL may be disposed on the bank BK. The light emitting element intermediate layer EL may contact a portion of the first anode electrode AE1, a portion of the second anode electrode AE2, and a portion of the fourth anode electrode AE4 respectively through a plurality of bank holes.

As shown in FIG. 8, at least one spacer SPC may be present between the light emitting element intermediate layer EL and the bank BK.

As shown in FIG. 8, the cathode electrode CE may be disposed on the light emitting element intermediate layer EL. The cathode electrode CE may include a plurality of cathode holes CH. A plurality of cathode holes CH formed in the cathode electrode CE may be disposed in the optical area OA (OA1).

One cathode hole CH illustrated in FIG. 8 may be a cathode hole positioned between the first emission area EA1 and the fourth emission area EA4.

As shown in FIG. 8, an encapsulation part may be positioned on the cathode electrode CE. The encapsulation part may include an encapsulation layer ENCAP formed on the cathode electrode CE.

As shown in FIG. 8, the encapsulation layer ENCAP may be a layer that prevents or reduces penetration of moisture or oxygen into the light emitting elements ED1, ED2, and ED4 disposed under the encapsulation layer ENCAP. In particular, the encapsulation layer ENCAP may prevent or reduce penetration of moisture or oxygen into the light emitting element intermediate layer EL, which may include an organic film. Here, the encapsulation layer ENCAP may be composed of a single film or a multi-film structure.

As shown in FIG. 8, the encapsulation layer ENCAP may include a first encapsulation layer PAS1, a second encapsulation layer PCL, and a third encapsulation layer PAS2. The first encapsulation layer PAS1 and the third encapsulation layer PAS2 may be inorganic films, and the second encapsulation layer PCL may be an organic layer.

As the second encapsulation layer PCL may be formed of an organic film, the second encapsulation layer PCL may serve as a planarization layer.

In another aspect, the display panel 110 according to example embodiments of the present disclosure may include a touch sensor. In this case, the display panel 110 according to example embodiments of the present disclosure may include a touch sensor portion formed on the encapsulation layer ENCAP.

As shown in FIG. 8, the touch sensor portion may include touch sensor metals TSM and bridge metals BRG and may further include insulation film components, such as a sensor buffer layer S-BUF, a sensor inter-layer insulation film S-ILD, and a sensor protection layer S-PAC.

The sensor buffer layer S-BUF may be disposed on the encapsulation layer ENCAP. The bridge metals BRG may be disposed on the sensor buffer layer S-BUF. The sensor inter-layer insulation film S-ILD may be disposed on the bridge metals BRG.

The touch sensor metals TSM may be disposed on the sensor inter-layer insulation film S-ILD. Some of the touch sensor metals TSM may be connected respectively to the corresponding bridge metals BRG through corresponding holes in the sensor inter-layer insulation film S-ILD.

As shown in FIG. 8, the touch sensor metals TSM and the bridge metals BRG may be disposed in the optical bezel area OBA (OBA1). The touch sensor metals TSM and the bridge metals BRG may be disposed not to overlap the second emission area EA2 of the optical bezel area OBA (OBA1).

The plurality of touch sensor metals TSM may configure one touch electrode (or one touch electrode line) and may be disposed in a mesh form and electrically connected to one another. Some of the touch sensor metals TSM and some others of the touch sensor metals TSM may be electrically connected through a bridge metal BRG, configuring one touch electrode (or one touch electrode line).

The sensor protection layer S-PAC may be disposed to cover the touch sensor metals TSM and the bridge metals BRG.

In another aspect, where the display panel 110 is of a type that incorporates touch sensors, at least a portion of the touch sensor metals TSM positioned on the encapsulation layer ENCAP in the display area DA may extend and be disposed along an outer inclined surface of the encapsulation layer ENCAP to electrically connect to a pad (not illustrated) positioned further outside the outer inclined surface of the encapsulation layer ENCAP. Here, the pad may be disposed in the non-display area NDA and may be a metal pattern to which the touch driving circuit 260 is electrically connected.

In another aspect, the display panel 110 according to example embodiments of the present disclosure may include a color filter unit (not shown) formed on the encapsulation layer ENCAP or on the touch sensor unit. A color filter may be positioned corresponding to each subpixel. In the subpixel including the plurality of openings in the planarization layer, one color filter may include a plurality of openings. In the subpixel including the plurality of main emission areas EA, one color filter may include a plurality of main emission areas EA. Further, since a subpixel having a side mirror structure may have a main emission area corresponding to an opening and a sub emission area corresponding to an inclined surface, one color filter may include a plurality of main emission areas EA and a plurality of sub emission areas.

Figure 14:
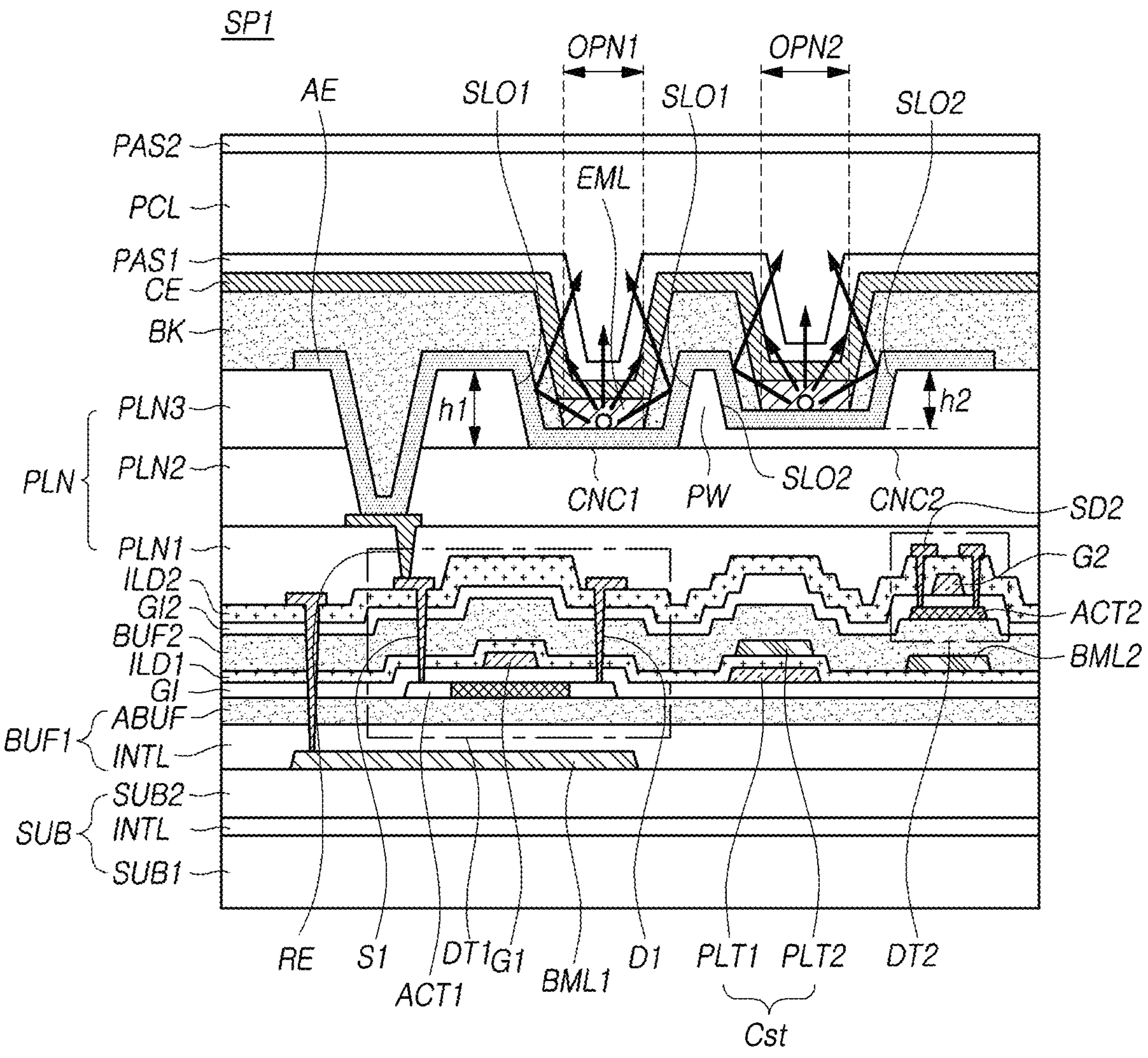

In the asymmetrically divided example side mirror structure of FIG. 14, the main emission area and sub emission area of the first opening OPN1 included in one color filter may be asymmetric with the main emission area and sub emission area, respectively, of the second opening OPN2. In the symmetrically divided example side mirror structure of FIG. 12, the main emission area and sub emission area of the first opening OPN1 included in one color filter may be symmetric with the main emission area and sub emission area, respectively, of the second opening OPN2.

The display panel 110 according to example embodiments of the present disclosure may further include a bank BK positioned on the first anode electrode AE1 and having a bank hole exposing a portion of the first anode electrode AE1 and a light emitting element intermediate layer EL positioned on the bank BK and contacting a portion of the first anode electrode AE1 exposed through the bank hole.

The bank hole formed in the bank BK may not overlap the plurality of cathode holes CH. In other words, at the point where the cathode hole CH is positioned, the bank BK is not depressed or bored through. Therefore, at the point where the cathode hole CH is positioned, the third planarization layer PLN3, the second planarization layer PLN2, and the first planarization layer PLN1 positioned under the bank BK are not depressed or bored through either.

An upper surface of the bank BK positioned under the plurality of cathode holes CH may be in a flat state without being damaged, meaning that the insulation layer, metal pattern (electrodes or lines), or light emitting element intermediate layer EL positioned under the cathode electrode CE may not be damaged by the process of forming the plurality of cathode holes CH in the cathode electrode CE.

The process of forming the plurality of cathode holes CH in the cathode electrode CE is briefly described below. A specific mask pattern may be deposited in positions where a plurality of cathode holes CH are to be formed, and a cathode electrode material may be deposited thereon. Accordingly, the cathode electrode material may be deposited only in an area without the specific mask pattern, so that the cathode electrode CE having a plurality of cathode holes CH may be formed. For example, the specific mask pattern may include an organic material and may include, e.g., a metal patterning layer MPL having a plurality of island patterns. The cathode electrode material may include a magnesium-silver (Mg—Ag) alloy.

Figure 9:
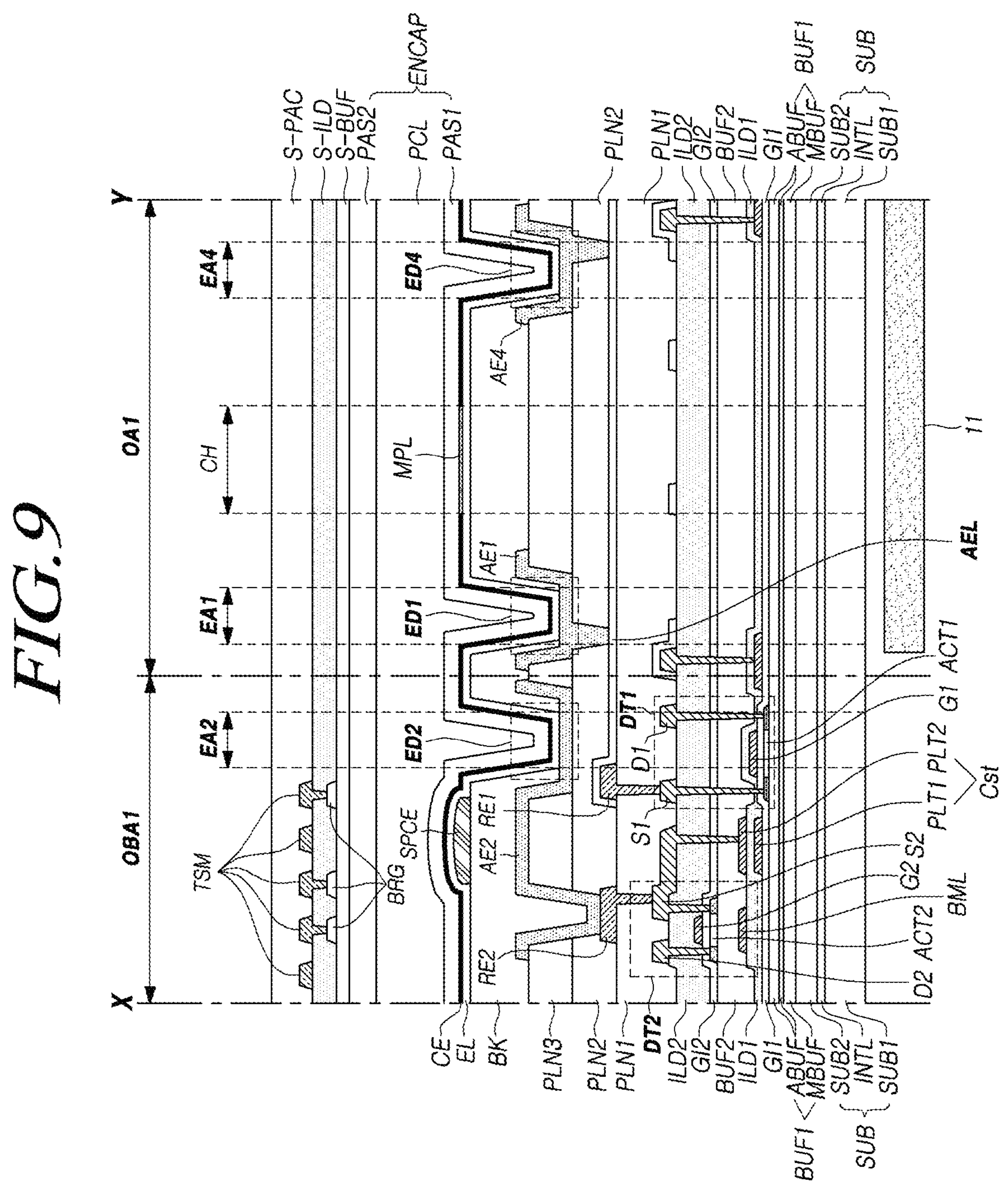

In another aspect, after the cathode electrode CE having the plurality of cathode holes CH is formed, the display panel 110 may be in a state in which the specific mask pattern is completely removed or in a state in which the whole or part of the specific mask pattern, e.g., a metal patterning layer MPL, remains (see, e.g., FIGS. 8 and 9).

The display panel 110 according to example embodiments of the present disclosure may include a first driving transistor DT1 disposed in the optical bezel area OBA (OBA1) to drive the first light emitting element ED1 disposed in the optical area OA (OA1) and a second driving transistor DT2 disposed in the optical bezel area OBA (OBA1) to drive the second light emitting element ED2 disposed in the optical bezel area OBA (OBA1).

The display panel 110 according to example embodiments of the present disclosure may further include a first planarization layer PLN1 disposed on the first driving transistor DT1 and the second driving transistor DT2, a first relay electrode RE1 positioned on the first planarization layer PLN1 and electrically connected to the first source electrode S1 of the first driving transistor DT1 through a hole in the first planarization layer PLN1, a second relay electrode RE2 positioned on the first planarization layer PLN1 and electrically connected to the second source electrode S2 of the second driving transistor DT2 through another hole in the first planarization layer PLN1, and a second planarization layer PLN2 and the third planarization layer PLN3 disposed on the first relay electrode RE1 and the second relay electrode RE2.

The display panel 110 according to example embodiments of the present disclosure may further include an anode extension line AEL connecting the first relay electrode RE1 and the first anode electrode AE1 and positioned on the first planarization layer PLN1.

The second anode electrode AE2 may be electrically connected to the second relay electrode RE2 through a hole in the third planarization layer PLN3 and the second planarization layer PLN2, and the first anode electrode AE1 may be electrically connected to the anode extension line AEL through another hole in the third planarization layer PLN3 and the second planarization layer PLN2.

The whole or a portion of the anode extension line AEL may be disposed in the optical area OA (OA1), and the anode extension line AEL may include a transparent material.

The first pixel circuit SPC1 may include a first driving transistor DT1 for driving the first light emitting element ED1. The second pixel circuit SPC2 may include a second driving transistor DT2 for driving the second light emitting element ED2.

The first active layer ACT1 of the first driving transistor DT1 and the second active layer ACT2 of the second driving transistor DT2 may be different from each other.

The display panel 110 according to example embodiments of the present disclosure may further include a substrate SUB, a first buffer layer BUF1 disposed between the substrate SUB and the first driving transistor DT1, and a second buffer layer BUF2 disposed between the first driving transistor DT1 and the second driving transistor DT2.

The first active layer ACT1 of the first driving transistor DT1 and the second active layer ACT2 of the second driving transistor DT2 may comprise different semiconductor materials.

For example, the second active layer ACT2 of the second driving transistor DT2 may include an oxide semiconductor material. For example, the oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), and zinc indium tin oxide (ZITO).

For example, the first active layer ACT1 of the first driving transistor DT1 and the second active layer ACT2 of the second driving transistor DT2 may comprise different semiconductor materials.

For example, the first active layer ACT1 of the first driving transistor DT1 may include a silicon-based semiconductor material. For example, the silicon-based semiconductor material may include low-temperature polycrystalline silicon (LTPS) or the like.

The display panel 110 according to example embodiments of the present disclosure may further include an encapsulation layer ENCAP on a first light emitting element ED1, a second light emitting element ED2, and a third light emitting element ED3, and a touch sensor metals TSM on the encapsulation layer ENCAP.

The touch sensor metals TSM may be disposed in the normal area NA and the optical bezel area OBA (OBA1). In the optical area OA (OA1), the touch sensor metals TSM may not be disposed or may be disposed at a lower density than in the normal area NA and the optical bezel area OBA (OBA1).

As shown in FIG. 8, the optical area OA (OA1) may overlap the optical electronic device (e.g., 11 or 12 in FIGS. 1A-1C). The optical bezel area OBA (OBA1) may not overlap the optical electronic device. In some cases, a portion of the optical bezel area OBA may overlap the optical electronic device.

The optical electronic device overlapping the optical area OA may be the first optical electronic device 11 and/or the second optical electronic device 12. For example, the optical electronic device may include a camera, an infrared sensor, or an ultraviolet sensor. For example, an optical electronic device may be a device that receives visible light and performs a predetermined operation, or may be a device that receives other rays (e.g., infrared rays, ultraviolet rays) than visible light and performs a predetermined operation.

The cross-sectional structure of the normal area NA may be the same as that of the optical bezel area OBA (OBA1) shown in FIG. 8. However, the first pixel circuit SPC1 disposed in the optical bezel area OBA to drive the first light emitting element ED1 disposed in the optical area OA (OA1) is not disposed in the normal area NA.

FIG. 9 is an example cross-sectional view illustrating a display panel 110, e.g., the optical bezel area OBA (OBA1) and the optical area OA (OA1) of the display panel 110 according to example embodiments of the present disclosure. However, FIG. 9 is a cross-sectional view where the 1:2 circuit connection scheme is applied as in FIG. 6.

The cross-sectional view of FIG. 9 has substantial similarities as the cross-sectional view of FIG. 8. The only difference is that the cross-sectional view of FIG. 8 adopts the 1:1 circuit unit connection scheme shown in FIG. 5 while the cross-sectional view of FIG. 9 adopts the 1:2 circuit unit connection scheme shown in FIG. 6. Thus, the following description of the cross-sectional structure of FIG. 9 focuses primarily on differences from the cross-sectional structure of FIG. 8.

As shown in FIG. 9, the first light emitting element ED1 and the fourth light emitting element ED4 disposed in the optical area OA (OA1) may be simultaneously driven by the first driving transistor DT1 disposed in the optical bezel area OBA (OBA1).

Therefore, as illustrated in FIG. 9, the anode extension line AEL may be further electrically connected to the fourth anode electrode AE4 separate from the first anode electrode AE1. In other words, the anode extension line AEL may be electrically connected to both the first anode electrode AE1 of the first light emitting element ED1 and the fourth anode electrode AE4 of the fourth light emitting element ED4.

As shown in FIG. 9, the anode extension line AEL may overlap the cathode hole CH positioned between the first light emitting element ED1 and the fourth light emitting element ED4 among the plurality of cathode holes CH.

As shown in FIG. 9, the first emission area EA1 by the first light emitting element ED1 and the fourth emission area EA4 by the fourth light emitting element ED4 may be emission areas emitting light of the same color.

Viewing angle improvement structures of the first, second, and fourth anode electrodes AE1, AE2, and AE4 in FIGS. 8 and 9 will be described in detail below.

Figure 10:
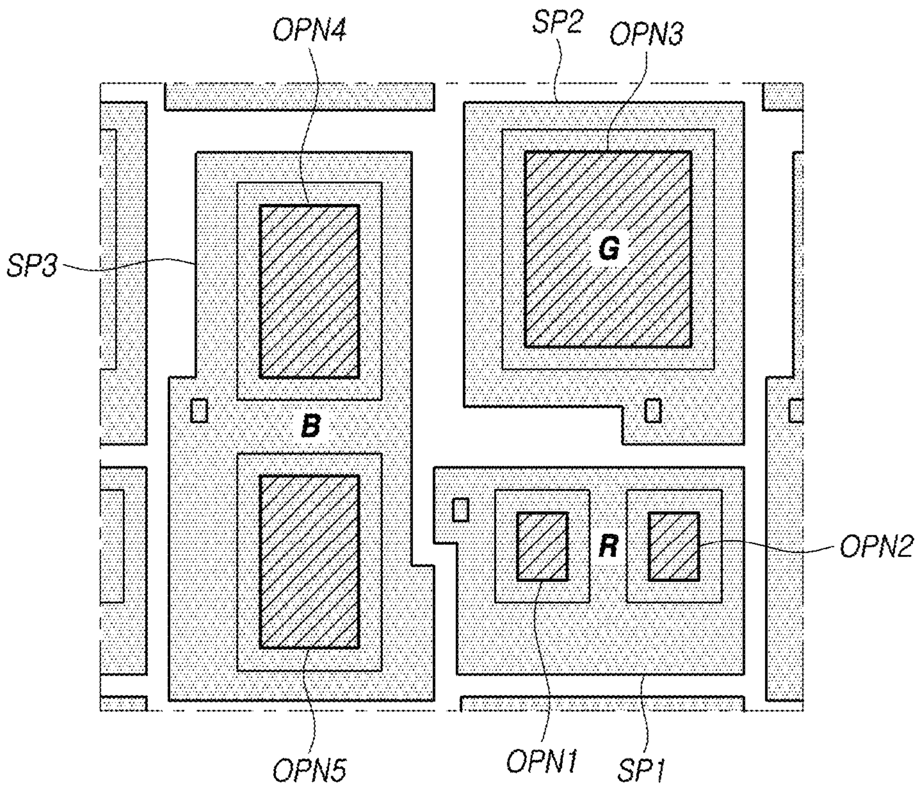
FIGS. 10 and 11 are plan views illustrating a display device according to example embodiments of the present disclosure.

FIG. 10 is a plan view illustrating a display device according to example embodiments of the present disclosure. More specifically, FIG. 10 is a plan view illustrating an example first pixel PXL1 positioned in the display area of the display device.

As shown in FIG. 10, the display device may include a first subpixel SP1 corresponding to a first color and a second subpixel SP2 corresponding to a second color different from the first color. That the first subpixel SP1 corresponds to the first color may mean that light having the first color is emitted from the emission area positioned in the first subpixel SP1. That the second subpixel SP2 corresponds to the second color may mean that light having the second color is emitted from the emission area positioned in the second subpixel SP2. In this example, the first subpixel SP1 and the second subpixel SP2 may be subpixels constituting the same first pixel PXL1. In other words, the first pixel PXL1 may include a first subpixel SP1 and a second subpixel SP2.

The first subpixel SP1 may include a first opening OPN1 and a second opening OPN2. Where the first subpixel SP1 includes the first opening OPN1 and the second opening OPN2, a change of the color coordinates of the display device in the side viewing angle direction to a direction of the complementary color of the first color may be mitigated.

In the disclosure, the openings of the subpixels may correspond to the emission areas described above with reference to FIGS. 3, 7, 8, and 9.

Each of the first opening OPN1 and the second opening OPN2 of the first subpixel SP1 may correspond to the main emission area positioned in the first subpixel SP1. Accordingly, the first subpixel SP1 may include two main emission areas. In this example, since the first subpixel SP1 corresponds to the first color, both the two main emission areas may emit light having the first color. As the first subpixel SP1 includes two main emission areas, a shift of the color coordinates of the display device in the side viewing angle direction to a direction of the complementary color of the first color may be mitigated.

The first subpixel SP1 may include two openings. In this example, the first opening OPN1 and the second opening OPN2 may have the same shape and area in the plan view of the display area. Here, the same shape and area may encompass minor differences (e.g., due to a processing or tolerance error) where the openings OPN1 and OPN2 would be regarded as having substantially the same shape and area.

The second subpixel SP2 may include a third opening OPN3. The second subpixel SP2 may include one opening. In this example, in the first subpixel SP1 and the second subpixel SP2 constituting one pixel PXL1, the first subpixel SP1 may include two openings OPN1 and OPN2, and the second subpixel SP2 may include one opening OPN3.

The display device may further include a third subpixel SP3 corresponding to a third color different from the first and second colors. In this example, the first color may be red (R), the second color may be green (G), and the third color may be blue (B). Further, the first pixel PXL1 may include a first subpixel SP1, a second subpixel SP3, and a third subpixel SP3.

The third subpixel SP3 may include a fourth opening OPN4 and a fifth opening OPN5. Where the third subpixel SP3 includes the fourth opening OPN4 and the fifth opening OPN5, a change of the color coordinates of the display device in the side viewing angle direction to a direction of the complementary color of the third color may be mitigated.

Each of the fourth opening OPN4 and the fifth opening OPN5 of the third subpixel SP3 may correspond to a main emission area positioned in the third subpixel SP3. Accordingly, the third subpixel SP3 may include two main emission areas. In this example, since the third subpixel SP3 corresponds to the third color, both the two main emission areas may emit light having the third color. As the third subpixel SP3 includes two main emission areas, a shift of the color coordinates of the display device in the side viewing angle direction to a direction of the complementary color of the third color may be mitigated.

The third subpixel SP3 may include two openings. In this example, the fourth opening OPN4 and the fifth opening OPN5 may have the same shape and area in the plan view of the display area. Here, the same shape and area may encompass minor differences (e.g., due to a processing or tolerance error) where the openings OPN4 and OPN5 would be regarded as having substantially the same shape and area.

Figure 11:
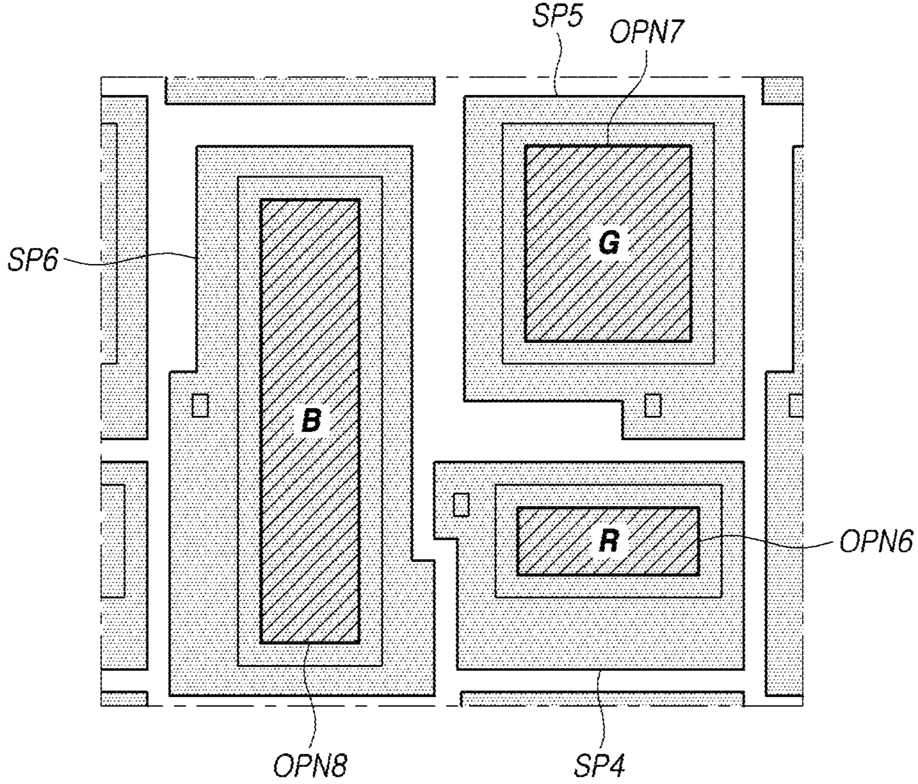

FIG. 11 is a plan view illustrating a display device according to example embodiments of the present disclosure. More specifically, FIG. 11 is a plan view illustrating an example second pixel PXL2 positioned in the display area of the display device.

As shown in FIG. 11, the second pixel PXL2 may include a fourth subpixel SP4, a fifth subpixel SP5, and a sixth subpixel SP6. The fourth subpixel SP4 may correspond to a first color, the fifth subpixel SP5 may correspond to a second color different from the first color, and the sixth subpixel SP6 may correspond to a third color different from the first color and the second color. In this example, the first color may be red (R), the second color may be green (G), and the third color may be blue (B).

Each of the subpixels constituting the second pixel PXL2 may include one opening. For example, the fourth subpixel SP4 may include a sixth opening OPN6, the fifth subpixel SP5 may include a seventh opening OPN, and the sixth subpixel SP6 may include an eighth opening OPN8. In other words, each of the subpixels constituting the second pixel PXL2 may include one main emission area.

Figure 12:
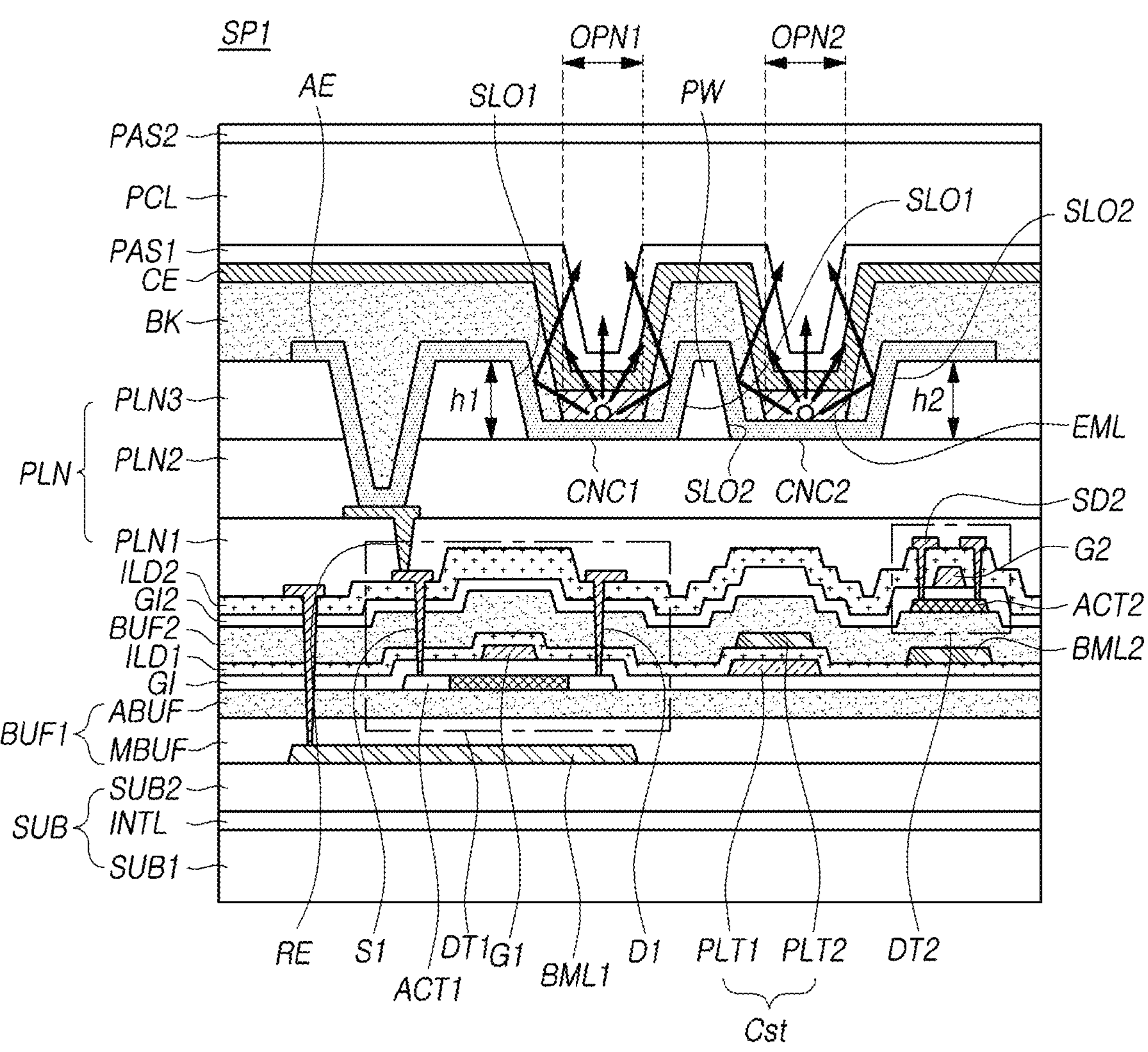
FIGS. 12, 13, and 14 are example cross-sectional views illustrating a display device according to example embodiments of the present disclosure.

FIG. 12 is an example cross-sectional view of a display device according to example embodiments of the present disclosure. More specifically, FIG. 12 is an example cross-sectional view illustrating an area including the first subpixel SP1 in the example display device of FIG. 10. When viewed in a vertical structure, the display device may include a transistor forming part, a light emitting element forming part, and an encapsulation part. The transistor forming part may include various circuit elements and lines for driving the light emitting element, and the encapsulation part may be a layer or layers positioned on the light emitting element to protect the light emitting element from external moisture and oxygen. FIG. 12 is a cross-sectional view illustrating a transistor forming part and a light emitting element forming part of an example display device.

As shown in FIG. 12, the display device may further include a planarization layer PLN, an anode electrode AE, a light emitting layer EML, a cathode electrode CE, and an encapsulation layer ENCAP.

The planarization layer PLN may be positioned on the transistor forming part of the display device. The planarization layer PLN may be a layer that planarizes the transistors DT1 and DT2 and the storage capacitor Cst and various lines disposed on the substrate SUB, and may be composed of a single layer or multiple layers. The planarization layer PLN may include, e.g., a first planarization layer PLN1, a second planarization layer PLN2 positioned on the first planarization layer PLN1, and a third planarization layer PLN3 positioned on the second planarization layer PLN2.

The planarization layer PLN may include a first concave portion CNC1, a second concave portion CNC2, a partition wall portion PW, a first inclined surface SLO1, and a second inclined surface SLO2 in the first subpixel SP1.

The first concave portion CNC1 may correspond to the first opening OPN1. The first opening OPN may be any one of a plurality of holes included in the bank BK and may be a hole positioned in the first subpixel SP1. Where the first concave portion CNC1 corresponds to the first opening OPN1, it may mean that the first concave portion CNC1 of the planarization layer PLN is positioned to overlap the first opening OPN1 in a plan view.

The second concave portion CNC2 may correspond to the second opening OPN2. The second opening OPN2 may be any one of a plurality of holes included in the bank BK and may be a hole positioned in the first subpixel SP1. Where the second concave portion CNC2 corresponds to the second opening OPN2, it may mean that the second concave portion CNC2 of the planarization layer PLN is positioned to overlap the second opening OPN2 in a plan view.

The partition wall portion PW may be positioned between the first concave portion CNC2 and the second concave portion CNC2. Since the partition wall portion PW is positioned between the first opening OPN1 and the second opening OPN2 of the first subpixel SP1 in this example, the first subpixel SP1 may include two or more openings OPN1 and OPN2.

The first inclined surface SLO1 may be positioned at a periphery of the first concave portion CNC1. As the first inclined surface SLO1 is positioned at a periphery of the first concave portion CNC1, the anode electrode AE positioned on the planarization layer PLN may reflect part of the light formed at the light emitting layer EML and extract the light to the outside of the display device. Thus, the display device may have excellent light efficiency and excellent luminance and color characteristics in the side viewing angle direction.

The second inclined surface SLO2 may be positioned at a periphery of the second concave portion CNC2. As the second inclined surface SLO2 is positioned at a periphery of the second concave portion CNC2, the anode electrode AE positioned on the planarization layer PLN may reflect part of the light formed at the light emitting layer EML and extract the light to the outside of the display device. Thus, the display device may have excellent light efficiency and excellent luminance and color characteristics in the side viewing angle direction.

The partition wall portion PW may include a first inclined surface SLO1 and a second inclined surface SLO2. An inclined plane adjacent to the first concave portion CNC1 in the partition wall portion PW may be the first inclined surface SLO1, and an inclined plane adjacent to the second concave portion CNC2 in the partition wall portion PW may be the second inclined surface SLO2. As the partition wall portion PW includes the first inclined surface SLO1 and the second inclined surface SLO2 in this example, the anode electrode AE may reflect light emitted from the light emitting layer EML toward the partition wall portions PW and extract the reflected light to the outside of the display device. As a result, the display device may have excellent light efficiency and excellent luminance and color characteristics in the side viewing angle direction.

The anode electrode AE may be positioned on the planarization layer PLN. The anode electrode AE may be positioned on the first concave portion CNC1, the second concave portion CNC2, the partition wall portion PW, the first inclined surface SLO1, and the second inclined surface SLO2. In this example, the anode electrode AE may be a reflective electrode. As the anode electrode AE is positioned as described above, the anode electrode AE may be formed on the light emitting layer EML to reflect light directed to the inclined surfaces SLO1 and SLO2 and the partition wall portion PW and may extract the light to the outside of the display device. The subpixel having the side mirror structure may have a main emission area EA corresponding to the opening (e.g., OPN1 or OPN2) and a sub emission area (not shown) corresponding to the inclined surface (e.g., SLO1 or SLO2). The sub emission area may have a shape of a band surrounding the main emission area or may have a shape of a partially discontinuous band. As a result, the display device may have excellent light efficiency and excellent luminance and color characteristics in the side viewing angle direction.

The light emitting layer EML may be positioned on the electrode AE exposed by the first opening OPN1 and the second opening OPN2 (e.g., in the bank BK). More specifically, the light emitting layer EML may be positioned on a portion of the anode electrode AE exposed by the first opening OPN1 and a portion of the anode electrode AE exposed by the second opening OPN2.

A shape in which the anode electrode AE positioned on the inclined surfaces SLO1 and SLO2 reflects the light generated from the light emitting layer EML with one opening divided into two openings OPN1 and OPN2 by the partition wall PW as illustrated in FIG. 12 may be referred to as a divided side mirror structure. The divided side mirror structure may include a plurality of concave portions CNC1 and CNC2 divided by the partition wall portion PW and may include inclined surfaces SLO1 and SLO2 reflecting light formed from the light emitting layer EML positioned in the plurality of concave portions CNC1 and CNC2.

The first height h1 of the first inclined surface SLO1 with respect to the first concave portion CNC1 and the second height h2 of the second inclined surface SLO2 with respect to the second concave portion CNC2 may be the same. In the disclosure, a height of an inclined surface with respect to an adjacent concave portion may be referred to as a "height of the inclined surface." Where the height of the first inclined surface SLO1 is the same as the height of the second inclined surface SLO2, the first subpixel SP1 may have uniform optical characteristics in the first opening OPN1 and the second opening OPN2. Here, the same height may encompass minor differences (e.g., due to a processing or tolerance error) where the height would be regarded as being substantially the same.

The angle of the first inclined surface SLO1 with respect to a bottom surface of the first concave portion CNC1 and the angle of the second inclined surface SLO2 with respect to a bottom surface of the second concave portion CNC2 may be the same. The angle of the inclined surface from the adjacent concave portion may be referred to as the "angle of the inclined surface." Both the angle of the first inclined surface SLO1 and the angle of the second inclined surface SLO2 may exceed 90 degrees. Where the angle of the first inclined surface SLO1 and the angle of the second inclined surface SLO2 exceed 90 degrees, the anode electrode AE positioned on the first inclined surface SLO1 and the second inclined surface SLO2 may effectively extract light generated from the light emitting layer EML to the outside of the display device.

The angle of the first inclined surface SLO1 and the angle of the second inclined surface SLO2 may be the same as each other. Where the angle of the first inclined surface SLO1 is the same as the angle of the second inclined surface SLO2, the first subpixel SP1 may have uniform optical characteristics in the first opening OPN1 and the second opening OPN2. Here, the same angle may encompass minor differences (e.g., due to a processing or tolerance error) where the angle would be regarded as being substantially the same.

The first subpixel SP1 may have a divided side mirror structure as described above. However, the second subpixel SP1, which is another subpixel of the display device, may have an undivided side mirror structure (see, e.g., FIG. 13).

The transistor forming part may include a substrate SUB, a first buffer layer BUF1 positioned on the substrate SUB, and various transistors DT1 and DT2, storage capacitor Cst, and various electrodes or signal lines positioned on the first buffer layer BUF.

The substrate SUB may include a first substrate SUB1 and a second substrate SUB2. An intermediate film INTL may be present between the first and second substrates SUB1 and SUB2. For example, the intermediate film INTL may be an inorganic film and may block or reduce moisture penetration.

The first buffer layer BUF1 may have a single film or multi-film structure. Where the first buffer layer BUF1 is formed in a multi-film structure, the first buffer layer BUF1 may include a multi-buffer layer MBUF and an active buffer layer ABUF.

Various transistors (e.g., DT1 and DT2), storage capacitor Cst, and various electrodes or signal lines may be formed on the first buffer layer BUF1.

The first driving transistor DT1 may include a first active layer ACT1, a first gate electrode G1, a first source electrode S1, and a first drain electrode D1.

The second driving transistor DT2 may include a second active layer ACT2, a second gate electrode G2, and a second source-drain electrode SD2.

The second active layer ACT2 of the second driving transistor DT2 may be positioned higher than (or above) the first active layer ACT1 of the first driving transistor DT1.

The storage capacitor Cst may include a first capacitor electrode PLT1 and a second capacitor electrode PLT2.

A first lower metal BML1 may be disposed under the first active layer ACT1 of the first driving transistor DT1. The first lower metal BML1 may overlap the whole or a part of the first active layer ACT1.

A second lower metal BML2 may be disposed under the second active layer ACT2 of the second driving transistor DT2. The second lower metal BML2 may overlap the whole or a part of the second active layer ACT2.

The light emitting element forming part may be positioned on the planarization layer PLN. The light emitting element forming part may include a light emitting element positioned on the planarization layer PLN.

The bank BK may be positioned on the anode electrode AE. The bank BK may include a plurality of openings (e.g., OPN1 and OPN2), and each of the openings OPN1 and OPN2 may be positioned to overlap a portion of the anode electrode AE. The bank BK overlapping a portion of the anode electrode AE may be a non-emission area that separates or spaces apart the main emission area EA and the sub emission area from each other.

The light emitting layer EML may be positioned on the bank BK or on the anode electrode AE exposed by the openings OPN1 and OPN2 in the bank BK. FIG. 12 illustrates example embodiments in which the light emitting layer EML is patterned, but the light emitting layer EML may be commonly deposited on the front surface of the display area. The light emitting layer EML may contact a portion of the anode electrode AE through the openings OPN1 and OPN2 of the bank BK.

The anode electrode AE and the first source electrode S1 of the first driving transistor DT1 may be electrically connected by a relay electrode RE.

As shown in FIG. 12, the cathode electrode CE may be disposed on the bank BK. The cathode electrode CE may be disposed along the side surface of the bank BK and positioned on the light emitting layer EML in the openings OPN1 and OPN2 of the bank BK. That is, a portion of the cathode electrode CE may overlap the openings OPN1 and OPN2 of the bank BK. The light emitting element ED may be formed at a portion where the anode electrode AE, the light emitting layer EML, and the cathode electrode CE overlap. A light emitting area may be formed by the light emitting element ED. For example, the anode electrode AE may be a reflective electrode, and the cathode electrode CE may be a transparent electrode.

As shown in FIG. 12, the encapsulation layer ENCAP may be disposed on the cathode electrode CE to prevent or reduce external moisture or oxygen from entering the light emitting element ED. For example, the encapsulation layer ENCAP may include a first encapsulation layer PAS1, a second encapsulation layer PCL, and a third encapsulation layer PAS2. For example, the first encapsulation layer PAS1 and the third encapsulation layer PAS2 may be inorganic films, and the second encapsulation layer PCL may be an organic film. For example, the thickness of the second encapsulation layer PCL may be greater than each of the first and third encapsulation layers PAS1 and PAS2.

Figure 13:
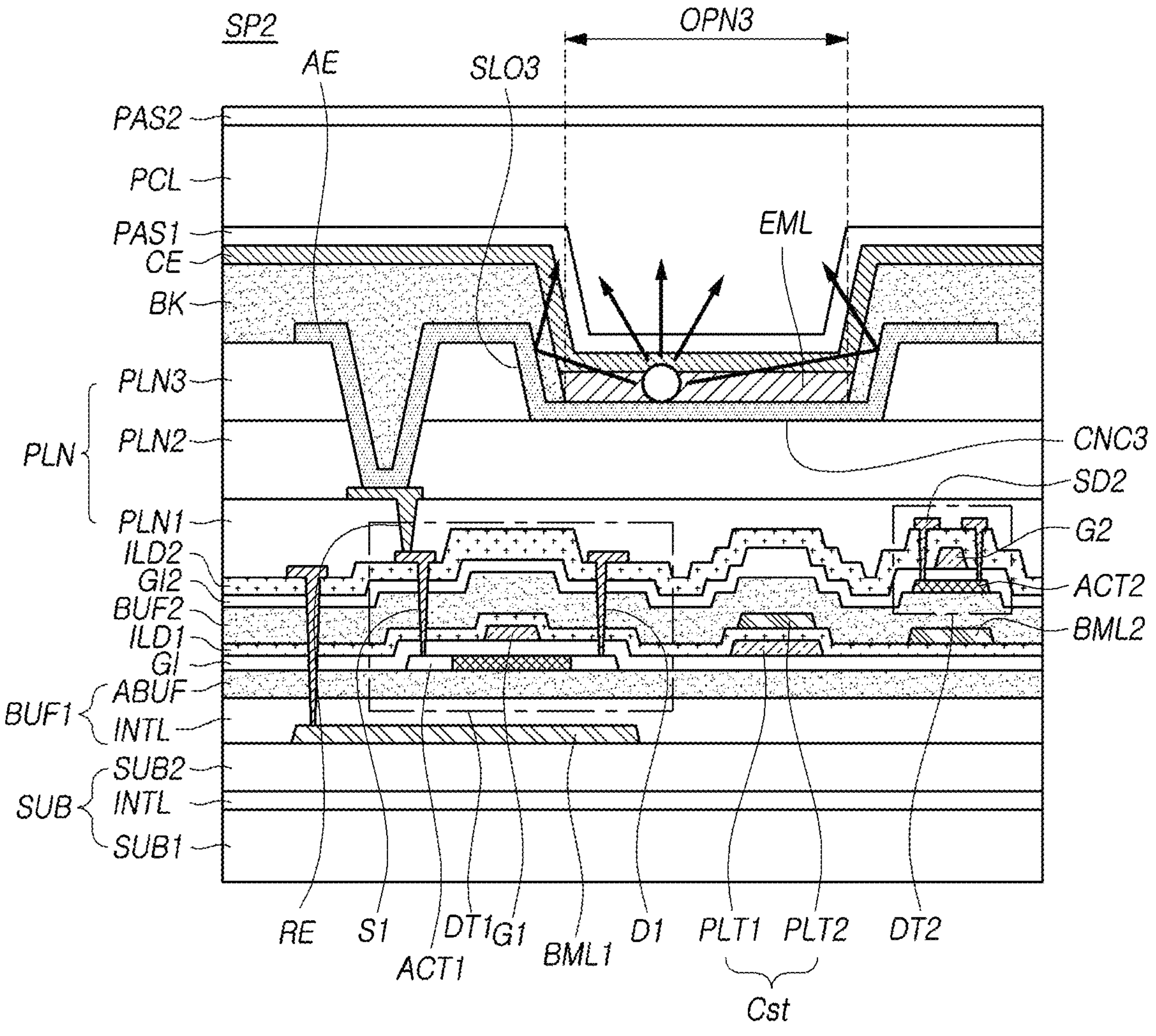

FIG. 13 is an example cross-sectional view illustrating a display device according to example embodiments of the present disclosure. More specifically, FIG. 13 is an example cross-sectional view illustrating an area including the second subpixel SP2 in the example display device of FIG. 10. Unless otherwise described, the matters regarding the display device according to the example embodiments illustrated in FIG. 13 may be the same as the matters of the display device described above with reference to FIG. 12.

As illustrated in FIG. 13, the planarization layer PLN may include a third concave portion CNC3 and a third inclined surface SLO3 positioned at a periphery of the third concave portion CNC3 in the second subpixel SP2. As the planarization layer PLN includes the above-described third concave portion CNC3 and the third inclined surface SLO3 in the second subpixel SP2, the anode electrode AE positioned on the third inclined surface SLO3 may reflect part of the light formed at the light emitting layer EML and extract the light to the outside of the display device. Thus, the display device may have excellent light efficiency and excellent luminance and color characteristics in the side viewing angle direction.

The above-described structure of the second subpixel SP2 may be referred to as an undivided side mirror structure. The undivided side mirror structure of the second subpixel SP2 differs from the divided side mirror structure of the first subpixel SP1 described above with reference to FIG. 12 in that the side mirror structure does not include a partition wall and includes one concave portion.

FIG. 14 is an example cross-sectional view illustrating a display device according to example embodiments of the present disclosure. More specifically, FIG. 14 is an example cross-sectional view of an area including a first subpixel SP1 in the example display device of FIG. 10, and is a cross-sectional view of the display device according to example embodiments different from those of FIG. 12. Unless otherwise described, the matters regarding the display device according to the example embodiments illustrated in FIG. 14 may be the same as the matters of the example display device described above with reference to FIG. 12.

As shown in FIG. 14, the first height h1 of the first inclined surface SLO1 with respect to the first concave portion CNC1 and the second height h2 of the second inclined surface SLO2 with respect to the second concave portion CNC2 may differ from each other. Where the first height h1 and the second height h2 are different from each other, side viewing angle characteristics of the light emitting element positioned in the first concave portion CNC1 and the light emitting element positioned in the second concave portion CNC2 may be different from each other.

This structure described with reference to FIG. 14 may be referred to as an asymmetrically divided side mirror structure. With reference to FIGS. 12 and 14, in the example embodiments illustrated in FIG. 12, the first subpixel SP1 may have the same side mirror structure at positions corresponding to the first opening OPN1 and the second opening OPN2, but in the example embodiments illustrated in FIG. 14, the first subpixel SP1 may have different side mirror structures at positions corresponding to the first opening OPN1 and the second opening OPN2. This divided side mirror structure of FIG. 14 may be referred to as an asymmetrically divided side mirror structure, and the divided side mirror structure of FIG. 12 may be referred to as a symmetrically divided side mirror structure. In the asymmetrically divided side mirror structure, the main emission area and sub emission area of the first opening OPN1 may be asymmetric with the main emission area and sub emission area, respectively, of the second opening OPN2 in one subpixel (e.g., SP1). In the symmetrically divided side mirror structure, the main emission area EA and sub emission area of the first opening OPN1 may be symmetric with the main emission area EA and sub emission area, respectively, of the second opening OPN2 in one subpixel (e.g., SP1).

Figure 15:
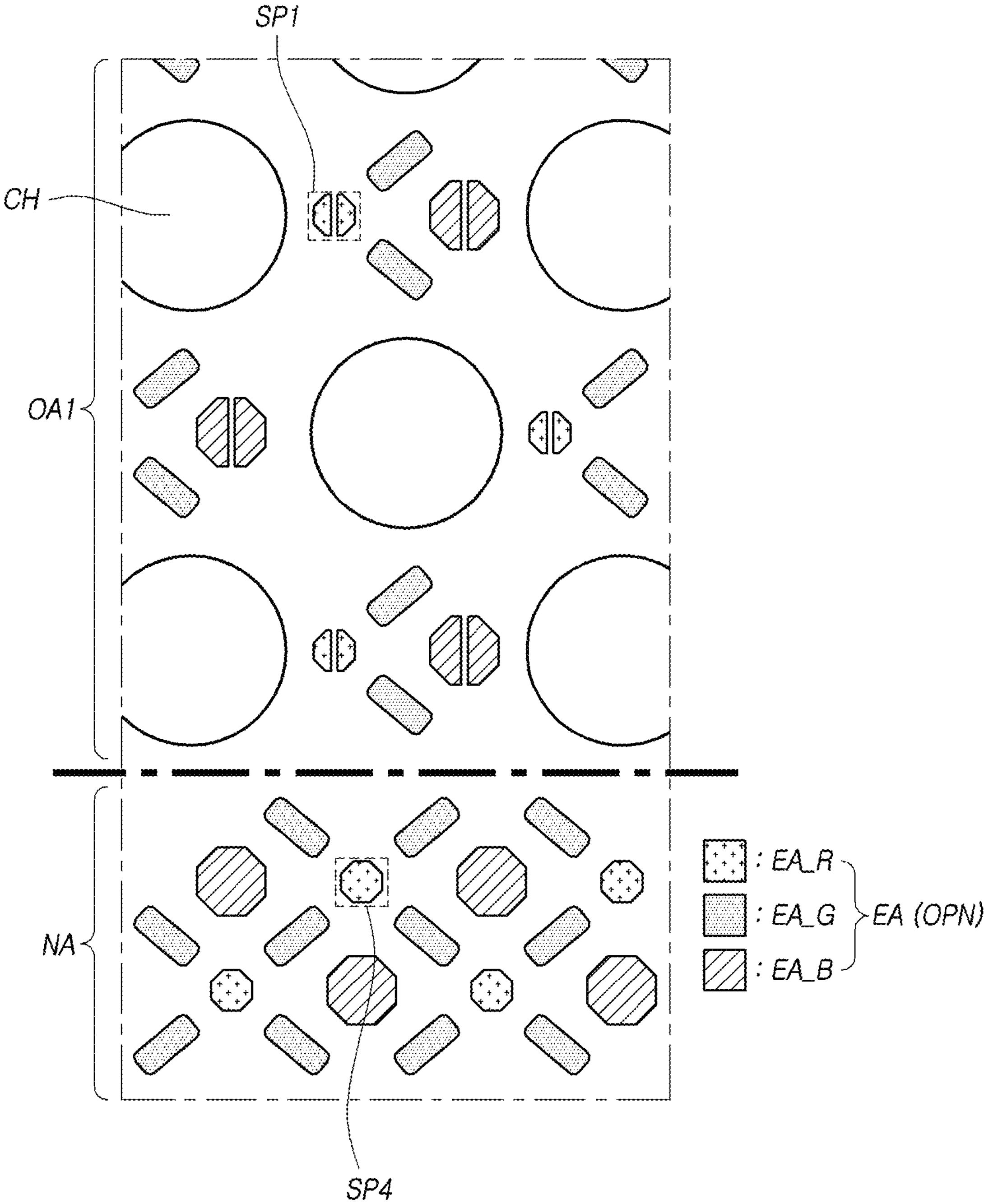
FIG. 15 is a plan view illustrating a display device according to example embodiments of the present disclosure.

FIG. 15 is a plan view illustrating a display device according to example embodiments of the present disclosure. More specifically, FIG. 15 is a plan view of the first optical area OA1 and the normal area NA of an example display device including the first optical area OA1 and the normal area NA positioned outside the first optical area OA1.

As illustrated in FIG. 15, the display device may include a display area including the first optical area OA1 and the normal area NA. The normal area NA may be positioned outside the first optical area OA1. The cathode electrode may include a plurality of cathode holes CH in the first optical area OA1.

As described above, a plurality of cathode holes CH may be positioned in the first optical area OA1 to secure transmittance. Accordingly, the number of pixels per unit area PPI in the first optical area OA1 may be smaller than the number of pixels per unit area PPI in the normal area NA.

Due to the difference in the number of pixels per unit area, the display quality in the side viewing angle direction may be deteriorated more significantly in the first optical area OA1 than in the normal area NA. For example, deterioration of luminance and shift of color coordinates in the side viewing angle direction may be more significant in the first optical area OA1 than in the normal area NA. To address these issues, the first subpixel SP1 positioned in the first optical area OA1 may have a divided side mirror structure.

The first subpixel SP1 may be positioned in the first optical area OA1. The first subpixel SP1 may correspond to the first subpixel SP1 described above with reference to FIGS. 12 and 14. In this example, the first subpixel SP1 positioned in the first optical area OA1 may have the divided side mirror structure (symmetrical or asymmetrical) described above. Where the first subpixel SP1 positioned in the first optical area OA1 has a divided side mirror structure, more pronounced luminance deterioration or shift of color coordinates in the side viewing angle direction in the first optical area OA1 than in the normal area NA may be mitigated.

For example, the display device may include a red emission area EA_R, a green emission area EA_G, and a blue emission area EA_B. In this example, in the display device, color coordinates in the side viewing angle direction may be further shifted to the direction of the complementary color of red and the complimentary color of blue. Where the divided side mirror structure is applied to the subpixel corresponding to red and the subpixel corresponding to blue, the shift of color coordinates of the display device in the side viewing angle direction to the direction of the complementary color of red and the complimentary color of blue may be mitigated.

The fourth subpixel SP4 may be positioned in the normal area NA. The fourth subpixel SP4 positioned in the normal area NA may not have a divided side mirror structure but may have an undivided side mirror structure.

Figure 16:
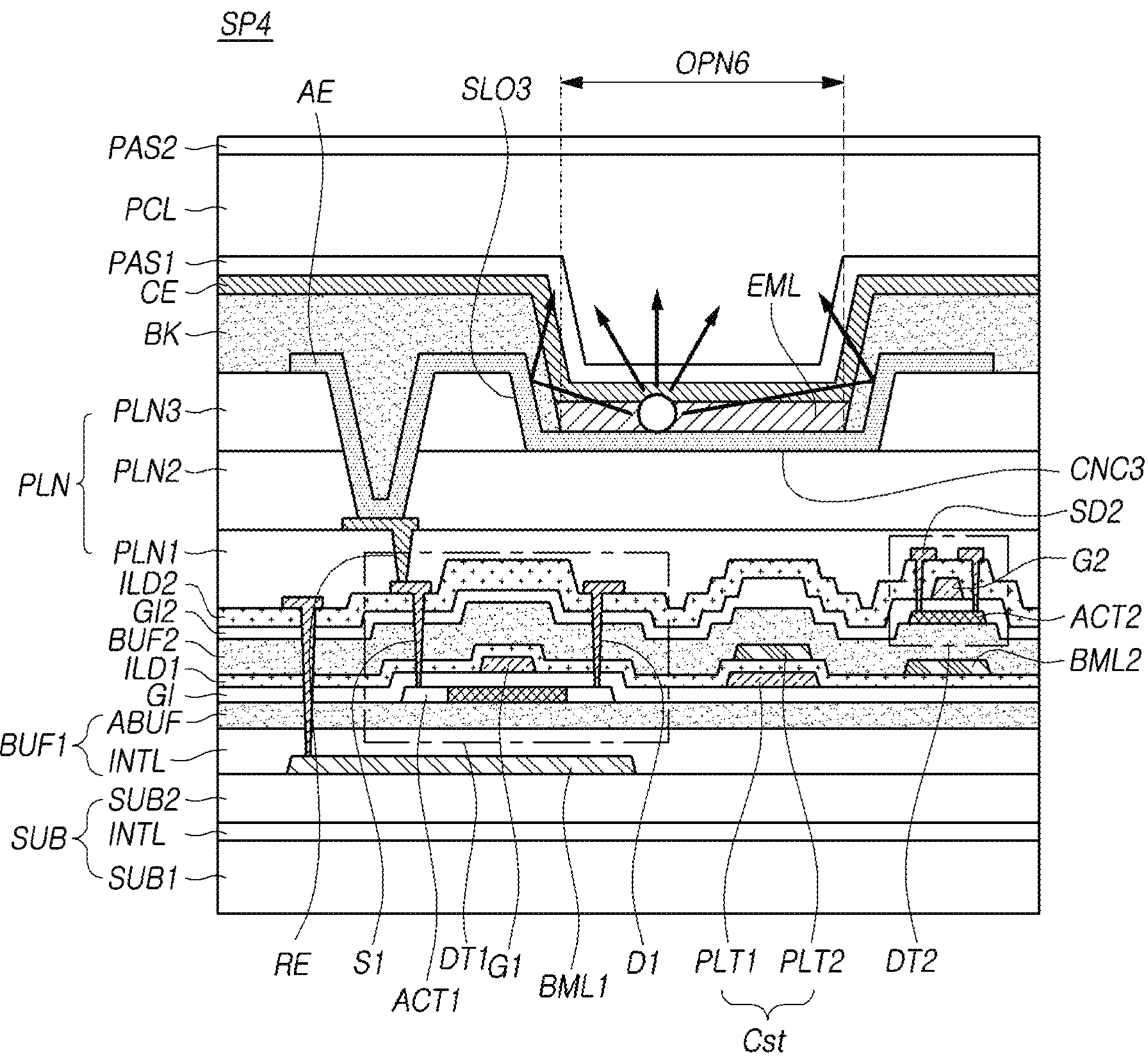
FIG. 16 is an example cross-sectional view illustrating a display device according to example embodiments of the present disclosure.

FIG. 16 is an example cross-sectional view illustrating a display device according to example embodiments of the present disclosure. More specifically, FIG. 16 may be an example cross-sectional view of the fourth subpixel SP4 of FIG. 15. Unless otherwise described, the matters regarding the display device according to the example embodiments illustrated in FIG. 16 may be the same as the matters of the example display device described above with reference to FIG. 13.

As shown in FIG. 16, the display device may include a fourth subpixel SP4, a planarization layer PLN, an anode electrode AE, and a light emitting layer EML.

The fourth subpixel SP4 may include a sixth opening OPN6. The planarization layer PLN may include a third concave portion CNC3 corresponding to the sixth opening OPN6 in the fourth subpixel SP4 and a third inclined surface SLO3 positioned at a periphery of the third concave portion CNC3. The anode electrode AE may be positioned on the third concave portion CNC3 and the third inclined surface SLO3. The light emitting layer EML may be positioned on the anode electrode AE exposed by the sixth opening OPN6 (e.g., in the bank BK). In other words, the fourth subpixel SP4 may have the undivided side mirror structure described above with reference to FIG. 13.

As shown in FIGS. 15 and 16, where the fourth subpixel SP4 positioned in the normal area NA includes a side mirror structure, the display device may have better light efficiency and better display quality in the side viewing angle direction.

In another example, where the first subpixel SP1 positioned in the first optical area OA1 has a divided side mirror structure and the fourth subpixel SP4 positioned in the normal area NA has an undivided side mirror structure, further deterioration of the display quality of the first optical area OA1 in the side viewing angle direction may be mitigated, thereby mitigating visual heterogeneity between the first optical area OA1 and the normal area NA.

In another example, where the first subpixel SP1 positioned in the first optical area OA1 has an asymmetrically divided side mirror structure and the fourth subpixel SP4 in the normal area NA has an undivided side mirror structure, visual heterogeneity between the first optical area OA1 and the normal area NA in the side viewing angle direction may be further mitigated.

As shown in FIG. 14, a first height h1 of the first inclined surface SLO1 may be larger than a second height h2 of the second inclined surface SLO2. As the height of the inclined surface increases, it is possible to reduce deterioration of luminance and color coordinate characteristics in the side viewing angle direction more effectively. In other words, with reference FIG. 14, the first inclined surface SLO1 corresponding to the first opening OPN1 may have a larger display quality enhancement effect in the side viewing angle direction than the second inclined surface SLO2 corresponding to the second opening OPN2.

Figure 17:
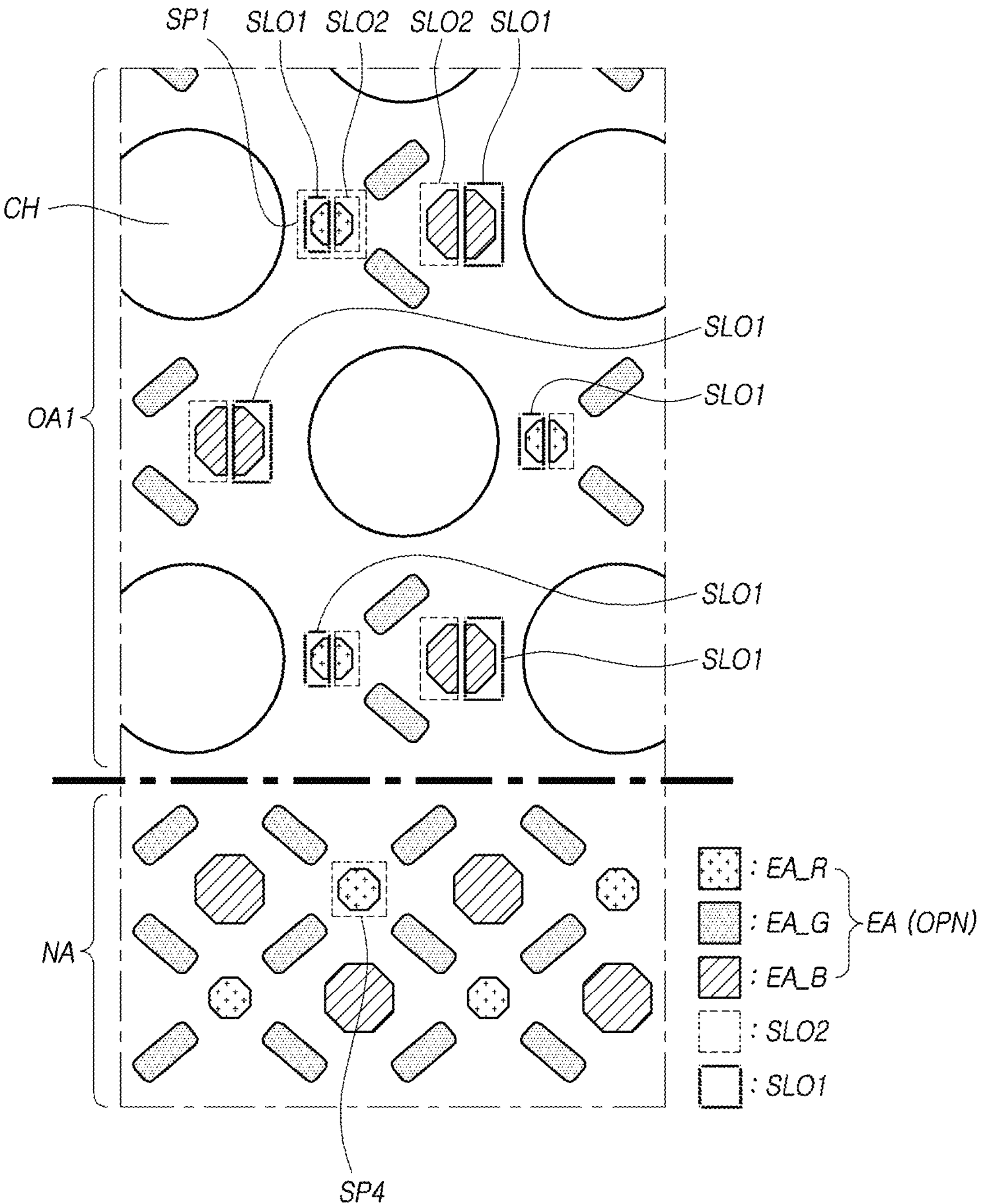
FIG. 17 is a plan view illustrating a display device according to example embodiments of the present disclosure.

FIG. 17 is a plan view illustrating a display device according to example embodiments of the present disclosure. More specifically, FIG. 17 is a plan view of the first optical area OA1 and the normal area NA of an example display device including the first optical area OA1 and the normal area NA positioned outside the first optical area OA1.

As illustrated in FIG. 17, the first subpixel SP1 positioned in the first optical area OA1 may have a divided side mirror structure, and the fourth subpixel SP4 positioned in the normal area NA may have an undivided side mirror structure. In this example, the first subpixel SP1 may have the asymmetrically divided side mirror structure described above with reference to FIG. 14.

With reference to FIGS. 14 and 17, it may be identified where the first inclined surface SLO1 having the first height h1 and the second inclined surface SLO2 having the second height h2 in the emission area EA_R are positioned on the plane. For example, the first concave portion CNC1 of the first subpixel SP1 may be positioned closer to the cathode hole CH than the second concave portion CNC2. As described above with reference to FIG. 14, the first inclined surface SLO1 may be positioned at a periphery of the first concave portion CNC1, and the second inclined surface SLO2 may be positioned at a periphery of the second concave portion CNC2. In FIG. 17, a first concave portion where a first inclined surface SLO1 is positioned and a second concave portion where a second inclined surface SLO2 is positioned in the first subpixel SP1 are shown. Although FIG. 17 shows areas corresponding to the first inclined surface SLO1 and the second inclined surface SLO2 in rectangular shapes for better understanding, it may be identified from FIG. 14 that the first inclined surface SLO1 and the second inclined surface SLO2 may be positioned outside along the boundary surface of the opening.

As illustrated in FIG. 14, the first inclined surface SLO1 may have a first height h1 with respect to the first concave portion CNC1, and the second inclined surface SLO2 may have a second height h2 with respect to the second concave portion CNC2. In this example, the first height h1 may be larger than the second height h2. As described above, in the side mirror structure, as the height of the inclined surface with respect to the concave portion increases, enhancement in the luminance and color coordinates in the side viewing angle direction may increase. As shown in FIG. 17, in the first subpixel SP1, the first inclined surface SLO1 having the larger height may be positioned on the side closer to the cathode hole CH, and the second inclined surface SLO2 having the smaller height may be positioned on the side farther away from the cathode hole CH. Accordingly, the display device according to the example embodiments illustrated in FIG. 17 may have a further enhanced side view angle display quality in the first optical area OA1 in which the plurality of cathode holes CH are positioned.

Example embodiments of the present disclosure described above are briefly described below.

A display device 100 may comprise a first subpixel SP1 and a second subpixel SP2. The first subpixel SP1 may correspond to a first color and may include a first opening OPN1 and a second opening OPN2 (e.g., in a bank BK). The second subpixel SP2 may correspond to a second color different from the first color and may include a third opening OPN3 (e.g., in the bank BK).

The display device 100 may comprise a third subpixel SP3. The third subpixel SP3 may correspond to a third color. The third color may be different from the first color and the second color. The third subpixel SP3 may include a fourth opening OPN4 and a fifth opening OPN5 (e.g., in the bank BK).

The first color may be red, the second color may be green, and the third color may be blue.

The first opening OPN1 and the second opening OPN2 may have the same shape and area on a plane of a display area DA.

The display device 100 may comprise a planarization layer PLN, an anode electrode AE, and a light emitting layer EML.

The planarization layer PLN may include a first concave portion CNC1, a second concave portion CNC2, a partition wall portion PW, a first inclined surface SLO1, and a second inclined surface SLO2.

The first concave portion CNC1 may correspond to the first opening OPN1 in the first subpixel SP1. The second concave portion CNC2 may correspond to the second opening OPN2 in the first subpixel SP1. The partition wall portion PW may be positioned between the first concave portion CNC1 and the second concave portion CNC2. The first inclined surface SLO1 may be positioned at a periphery of the first concave portion CNC1. The second inclined surface SLO2 may be positioned at a periphery of the second concave portion CNC2. The anode electrode AE may be positioned on the first concave portion CNC1, the second concave portion CNC2, the partition wall portion PW, the first inclined surface SLO1, and the second inclined surface SLO2. The light emitting layer EML may be positioned on the electrode AE exposed by the first opening OPN1 and the second opening OPN2 in the bank BK.

The partition wall portion PW may include a first inclined surface SLO1 and a second inclined surface SLO2.

The first height h1 of the first inclined surface SLO1 with respect to the first concave portion CNC1 and the second height h2 of the second inclined surface SLO2 with respect to the second concave portion CNC2 may be the same.

The first height h1 of the first inclined surface SLO1 with respect to the first concave portion CNC1 and the second height h2 of the second inclined surface SLO2 with respect to the second concave portion CNC2 may be different from each other.

The display device 100 may include a display area DA and a cathode electrode CE in the display area DA. The display area DA may include a first optical area OA1 and a normal area NA positioned outside the first optical area OA1. The cathode electrode CE may include a plurality of cathode holes CH in the first optical area OA1. The first subpixel SP1 may be positioned in the first optical area OA1.

The number of pixels per unit area in the first optical area OA1 may be smaller than the number of pixels per unit area in the normal area NA.

The display device 100 may comprise a fourth subpixel SP4, a planarization layer PLN, an anode electrode AE, and a light emitting layer EML.

The fourth subpixel SP4 may be positioned in the normal area NA and may include a sixth opening OPN6 (e.g., in the bank BK).

The planarization layer PLN may include a third concave portion CNC3 and a third inclined surface SLO3. The third concave portion CNC3 may correspond to the sixth opening OPN6 in the fourth subpixel SP4. The third inclined surface SLO3 may be positioned at a periphery of the third concave portion CNC3. The anode electrode AE may be positioned on the third concave portion CNC3 and the third inclined surface SLO3. The light emitting layer EML may be positioned on the anode electrode AE exposed by the sixth opening OPN6 in the bank BK.

The display device 100 may comprise a planarization layer PLN, an anode electrode AE, and a light emitting layer EML.

The planarization layer PLN may include a first concave portion CNC1, a second concave portion CNC2, a partition wall portion PW, a first inclined surface SLO1, and a second inclined surface SLO2.

The first concave portion CNC1 may correspond to the first opening OPN1 in the first subpixel SP1. The second concave portion CNC2 may correspond to the second opening OPN2 in the first subpixel SP1. The partition wall portion PW may be positioned between the first concave portion CNC1 and the second concave portion CNC2. The first inclined surface SLO1 may be positioned at a periphery of the first concave portion CNC1. The second inclined surface SLO2 may be positioned at a periphery of the second concave portion CNC2. The anode electrode AE may be positioned on the first concave portion CNC1, the second concave portion CNC2, the partition wall portion PW, the first inclined surface SLO1, and the second inclined surface SLO2. The light emitting layer EML may be positioned on the electrode AE exposed by the first opening OPN1 and the second opening OPN2 in the bank BK. The first height h1 of the first inclined surface SLO1 with respect to the first concave portion CNC1 and the second height h2 of the second inclined surface SLO2 with respect to the second concave portion CNC2 may be different from each other.

The first concave portion CNC1 may be positioned closer to an adjacent cathode hole CH than the second concave portion CNC2. A first height h1 of the first inclined surface SLO1 with respect to the first concave portion CNC1 may be larger than the height h2 of the second inclined surface SLO2 with respect to the second concave portion CNC2.

It will be apparent to those skilled in the art that the present disclosure is not limited by the above-described example embodiments and the accompanying drawings, and that various substitutions, modifications, and variations can be made in the present disclosure without departing from the spirit or scope of the disclosures. Therefore, the above example embodiments of the present disclosure are provided for illustrative purposes and are not intended to limit the scope or technical concept of the present disclosure. It is intended that the present disclosure cover all modifications and variations of this disclosure that come within the scope of the claims and their equivalents.

What is claimed:

1. A display device, comprising:

a substrate including a display area configured to display an image and a non-display area outside the display area; and a plurality of subpixels in the display area, the plurality of subpixels comprising:

a first subpixel of a first color, the first subpixel including a first opening corresponding to a first light emission area and a second opening spaced apart from the first opening and corresponding to a second light emission area; and a second subpixel of a second color different from the first color and including a third opening corresponding to a third light emission area.

2. The display device of claim 1, wherein the plurality of subpixels further comprises a third subpixel of a third color different from the first color and the second color, and the third subpixel including a fourth opening corresponding to a fourth light emission area and a fifth opening spaced apart from the fourth opening and corresponding to a fifth light emission area.

3. The display device of claim 2, wherein the first color is red, the second color is green, and the third color is blue, and the first subpixel, the second subpixel, and the third subpixel constitute a pixel.

4. The display device of claim 1, wherein the first opening and the second opening have a same shape and a same area in a plan view of the display area.

5. The display device of claim 1, further comprising:

a planarization layer over the substrate and including:

a first concave portion corresponding to the first opening in the first subpixel;

a second concave portion corresponding to the second opening in the first subpixel; and a partition wall portion positioned between the first concave portion and the second concave portion, the partition wall portion including a first inclined surface positioned at a periphery of the first concave portion and a second inclined surface positioned at a periphery of the second concave portion;

an anode electrode on the planarization layer over the first concave portion, the second concave portion, the partition wall portion, the first inclined surface, and the second inclined surface; and a light emitting layer on the anode electrode in the first opening and the second opening.

6. The display device of claim 5, further comprising:

a bank on the anode electrode over the first inclined surface and the second inclined surface of the planarization layer, the bank including the first opening in the first concave portion and the second opening in the second concave portion, wherein the first opening and the second opening in the bank expose the anode electrode, and the light emitting layer is disposed on the anode electrode exposed by the first opening and the second opening.

7. The display device of claim 5, wherein a first height of the first inclined surface with respect to a bottom surface of the first concave portion in a vertical direction is equal to or larger than a second height of the second inclined surface with respect to a bottom surface of the second concave portion in the vertical direction.

8. The display device of claim 7, further comprising:

a cathode electrode over planarization layer, the anode electrode, and the light emitting layer, wherein:

the first height is larger than the second height, the display area includes an optical area overlapping an optical electric device in a plan view and a normal area outside the optical area, the cathode electrode includes a cathode hole penetrating the cathode electrode in the optical area, the first subpixel is positioned adjacent to the cathode hole in the optical area, and the first concave portion is positioned closer to the cathode hole than the second concave portion is.

9. The display device of claim 1, wherein:

the display area includes an optical area to overlap an optical electric device and a normal area outside of the optical area, the plurality of subpixels further comprises a fourth subpixel of the first color in the normal area, and the first subpixel is in the optical area and includes more light emission areas than the fourth subpixel.

10. The display device of claim 1, further comprising:

a cathode electrode over the substrate, wherein:

the display area includes an optical area overlapping an optical electric device in a plan view and a normal area outside the optical area, the cathode electrode includes a plurality of cathode holes in the optical area, and the first subpixel is positioned in the optical area.

11. The display device of claim 10, wherein a number of pixels per unit area in first optical area is smaller than a number of pixels per unit area in the normal area.

12. The display device of claim 10, further comprising:

a planarization layer over the substrate;

an anode electrode on the planarization layer; and a light emitting layer on the anode electrode and under the cathode electrode, wherein:

the plurality of subpixels further comprises a fourth subpixel positioned in the normal area and including a sixth opening corresponding to a sixth light emission area;

the planarization layer includes a third concave portion corresponding to the sixth opening and a third inclined surface positioned at a periphery of the third concave portion in the fourth subpixel;

the anode electrode is positioned on the third concave portion and the third inclined surface; and the light emitting layer is positioned on the anode electrode exposed in the sixth opening.

13. A display device, comprising:

a substrate including:

a display area having an optical area and a normal area outside the optical area, the optical area and the normal area being configured to display an image, the optical area having at least one transmissive area configured to transmit light; and a non-display area outside the display area; and a plurality of subpixels in the optical area and the normal area, the plurality of subpixels comprising:

a first subpixel in the optical area and including a first opening corresponding to a first light emission area and a second opening spaced apart from the first opening and corresponding to a second light emission area, the first subpixel being configured to emit light of a first color at the first light emission area and the second light emission area.

14. The display device of claim 13, wherein:

the plurality of subpixels further comprises a second subpixel of the first color in the normal area, and the first subpixel includes more light emission areas than the second subpixel.

15. The display device of claim 13, further comprising:

a planarization layer over the substrate and including:

a first concave portion corresponding to the first opening in the first subpixel;

a second concave portion corresponding to the second opening in the first subpixel;

a partition wall portion positioned between and separating the first concave portion and the second concave portion;

a first inclined surface positioned at a periphery of the first concave portion; and a second inclined surface positioned at a periphery of the second concave portion;

an anode electrode on the planarization layer over the first concave portion, the second concave portion, the partition wall portion, the first inclined surface, and the second inclined surface;

a bank on the anode electrode over the first inclined surface and the second inclined surface, the bank including the first opening and the second opening; and a light emitting layer on the anode electrode exposed by the first opening and the second opening of the bank.

16. The display device of claim 15, wherein a first height of the first inclined surface with respect to a bottom surface of the first concave portion in a vertical direction is larger than a second height of the second inclined surface with respect to a bottom surface of the second concave portion in the vertical direction.

17. The display device of claim 16, further comprising:

a cathode electrode over planarization layer, the anode electrode, and the light emitting layer, the cathode electrode including a cathode hole adjacent to the first subpixel in the optical area, wherein the first concave portion is positioned closer to the cathode hole than the second concave portion is.

18. The display device of claim 15, wherein:

the first inclined surface is inclined at a first angle greater than 90 degrees with respect to a bottom surface of the first concave portion, and the second inclined surface is inclined at a second angle greater than 90 degrees with respect to a bottom surface of the second concave portion.

19. The display device of claim 18, wherein the first angle is equal to the second angle.

20. The display device of claim 13, wherein the plurality of subpixels further comprises:

a second subpixel in the optical area and including a third opening corresponding to a third light emission area, the second subpixel configured to emit light of a second color; and a third subpixel in the optical area and including a fourth opening corresponding to a fourth light emission area and a fifth opening spaced apart from the fourth opening and corresponding to a fifth light emission area, the third subpixel configured to emit light of a third color at the fourth light emission area and the fifth light emission area, and wherein the first color, the second color, and the third color are different from one another, and the first subpixel, the second subpixel, and the third subpixel constitute a pixel.

21. The display device of claim 13, wherein a number of pixels per unit area in the optical area is smaller than a number of pixels per unit area in the normal area.

22. A display device, comprising:

a substrate;

a plurality of subpixels on the substrate, the plurality of subpixels comprising:

a first subpixel including a first light emission area and a second light emission area spaced apart from the first light emission area, the first subpixel being configured to emit light of a first color at the first light emission area and the second light emission area; and a second subpixel of a second color different from the first color and including a third light emission area; and at least one transmissive area between the plurality of subpixels, the at least one transmissive area being configured to transmit light.

23. The display device of claim 22, further comprising:

a cathode electrode over the substrate and having at least one cathode hole, wherein the at least one cathode hole corresponds to the at least one transmissive area.

24. The display device of claim 23, wherein:

the substrate comprises an optical area configured to overlap an optical electric device and a normal area outside of the optical area, the optical area and the normal area being configured to display an image, and the first subpixel, the second subpixel, and the at least one cathode hole are in the optical area.

25. The display device of claim 22, wherein:

the substrate comprises an optical area configured to overlap an optical electric device and a normal area outside of the optical area, the optical area and the normal area being configured to display an image, and the plurality of subpixels further comprises a third subpixel of the first color in the normal area, and the first subpixel is in the optical area and includes more light emission areas than the third subpixel.

* * * * *